United States Patent [19]
Saito

[11] Patent Number: 5,459,686
[45] Date of Patent: Oct. 17, 1995

[54] MULTIPLE LEVEL RANDOM ACCESS MEMORY

[75] Inventor: Tamio Saito, San Jose, Calif.

[73] Assignee: Solidas Corporation, San Jose, Calif.

[21] Appl. No.: 136,161

[22] Filed: Oct. 15, 1993

[51] Int. Cl.$^6$ ................................................ G11C 11/24
[52] U.S. Cl. ........................... 365/149; 365/168; 365/206
[58] Field of Search ................................. 365/149, 168, 365/45, 189.11, 210, 206

[56]  References Cited

U.S. PATENT DOCUMENTS

| | | | |
|---|---|---|---|
| 4,661,929 | 4/1987 | Aoki et al. | 365/149 X |
| 5,184,324 | 2/1993 | Ohta | 365/149 |

FOREIGN PATENT DOCUMENTS

| | | |
|---|---|---|
| 60-239994 | 11/1985 | Japan . |
| 62-2650 | 1/1987 | Japan . |
| 63-195897 | 8/1988 | Japan . |
| 63-195896 | 8/1988 | Japan . |
| 1-192083 | 8/1989 | Japan . |

OTHER PUBLICATIONS

Ishizuka, O., et al. "On Design of Multiple–Valued Static Random–Access–Memory", *Proceedings of the Twentieth International Symposium of Multiple–Valued Logic*, May 23–25, 1990, Charlotte, N.C., pp. 11–17.

Primary Examiner—Joseph A. Popek

[57] ABSTRACT

A semiconductor memory device according to the present invention comprises a number of memory cells that store multiple voltage levels. Each voltage level is uniquely assigned to a different logic level. Multiple binary codes are converted to various analog voltage levels by a digital to analog converter. The memory cell of the invention comprises a storage capacitor and transfer gates, each terminal of which is connected to a bit line through the transfer gate for isolating the storage capacitor from the interference of other circuits while it is not accessed. In the writing cycle, analog voltage can be stored in the storage capacitor of each cell by applying the assigned analog voltage generated by the digital to analog converter through, bit lines and the transfer gates that control the conductivity between the bit lines and storage capacitor. In the reading cycle, a stored voltage can be applied to a digital to analog converter by making the transfer gates conductive between the storage capacitor and the bit lines. The invention further comprises a set of transfer gates, which comprises a pair of complementary types of transistors such as n-channel CMOS FET and p-channel CMOS FET, which are connected in a parallel configuration for the purpose of cancelling the gate to channel noise. The set of transfer gates is used in the connection between said storage capacitor and a set of bit lines to reduce the switching noise which limits the possible number of voltage levels in the storage capacitor which corresponds to the number of storable binary codes per unit cell. The pair of transistors similarly configured are also used to discharge the storage capacitor and stray capacitor between the bit lines for reducing noise interference to the storage capacitor.

25 Claims, 21 Drawing Sheets

5,459,686

MULTIPLE LEVEL RANDOM ACCESS MEMORY

FIELD OF THE INVENTION

This invention relates to a random access memory device (hereafter "RAM") which is able to store a number of binary codes of information in a unit memory cell by assigning multiple binary code information in different logic voltage levels (hereafter LVL). Each LVL is uniquely assigned to a different binary code. This invention provides the method to increase the number of quantumized voltage levels. Then, this invention increases the number of storable binary codes in a limited area within a semiconductor by increasing the number of voltage levels.

Current RAM memory technology stores only 1 bit of information per the unitcell register using flip-flop gates in the case of static random access memory (hereafter, "SRAM") or per capacitors in the case of dynamic random access memory (hereafter, "DRAM").

This invention provides two methods to increase the number of voltage levels. One method is to increase the power supply voltage of the circuit on the memory cell. The other method is to decrease the incremental differences between voltage levels by using a noise canceling circuit and combination of both techniques can be also implemented.

DESCRIPTION OF PRIOR ART

Currently in an SRAM and a DRAM cell, a single binary bit of data is stored in the unit memory cell by selecting and assigning a set of voltage levels which corresponds to "1" or "0."

In the case of DRAM, voltage is stored in a charge at the capacitance of a memory cell. Higher voltages, such as 3–5 volts, are normally assigned as "1" and lower voltage such as 0–2 volts is normally assigned as "0". This kind of cell normally has a threshold at 2.5 volts which demarcates "1" and "0" (FIG. 1).

In the case of SRAM, a set of flip-flop circuits determines that the "1" state is the condition that one of the transistors is "on" and the other transistor is "off," and the "0" state is the condition that each transistor is reversely assigned the "on"/"off" of the "1" state (FIG. 3).

In both the DRAM and the SRAM cases, the unitcell register has a sets of state which can represent "1" or "0", however, the unitcell cannot represent more than one bit at a time.

Currently in DRAM, as mentioned above, the unit storage capacitor can only store two different voltages. If the capacitor can store different voltage levels, then the information density per the unit physical area of the memory device can be increased. This will reduce the cost of memory at the order of number of levels and therefore, reduce the size of the semiconductor die at the order of number of LVLs. This invention provides the method and configuration which will enables a semiconductor to store the LVL in a unitcell having the function of digital to analog converter (hereafter, "D/A Converter") allowing it to convert multiple binary codes to the corresponding LVLs and then to store the LVL to a unit memory cell in the Write-cycle. In the Read-cycle, the stored LVL is converted to the corresponding multiple digits of binary codes by an analog to digital converter (hereafter, "A/D converter"), where D/A converting is made by a time dependent, varying voltage source, such as the a stair wave Vr shown in FIG. 7, and the selection of timing and A/D converting is made by a time dependent, varying reference voltage source, such as the stair wave Vref shown in FIG. 7.

This invention, further, provides the method to increase the number of LVLs by reducing the interference and noise which caused the prior art to be unable to have multiple LVL.

The reasons why the prior art of the DRAM was not able to store the LVL are as follows:

1) One reason is that one of terminal of each unit storage capacitor which stores the charge of state (hereafter, "Storage Capacitor") has been connected directly to the ground pattern which normally is made of the highly doped region of the semiconductor, polysilicon or metal to reduce the number of interconnections within the semiconductor die. However, the current which flows through the doped region increases noise interference from the switching of other memory cells or from other circuit noise, because the current generated or induced by other circuit current flows ("i") through the ground circuit which has the inductance ("L") and the resistance ("R"), and therefore the inductance and resistance generates a noise of $$L\frac{di}{dt}$$

and a voltage drop Ri. This noise changes the voltage stored in the storage capacitors statically and dynamically, therefore there exists certain limitations which reduce the quantumized increment voltage level (hereafter, "QVL") and which therefore limits the number of LVLs.

2) Another reason why the prior art was not capable of reducing the QVL and therefore not capable of increasing the number of LVLs is due to the switching noise of the transfergate, such as Q0 in FIG. 1, which is created by a gate-channel capacitance coupling of the MOS FET when the Transfergate changes state from on to off or off to on. The noise can change the voltage level of the Storage Capacitor to a degree where S/N ratio is not good enough to have multiple LVLS.

One objective of this invention is to reduce the QVL by reducing the noise of interference from the switching of cells and/or the switching of a select cell to have sufficient S/N ratio to allow multiple LVLs, such as 16 levels.

This invention provides two methods to reduce the noise. One method to reduce the noise is to make each Storage Capacitor isolatable by inserting transfergates (hereafter, "Transfergate") between the capacitor and the ground circuit which is normally made of a highly doped semiconductor region or metal and/or polysilicon ground pattern.

This Transfergate becomes connective when the specific cell is accessed to charge or discharge the storage capacitor of the selected unit cell (hereafter, "Unitcell"). When the Unitcell is not accessed to charge or discharge, the Transfergate disconnects or isolates the capacitor from the ground circuit, resulting in there is no noise interference through the ground circuit as happened with the prior art.

Another method provided by this invention is to significantly reduce the switching noise created when the Transfergate changes states by using complementary Transfergates connected in a parallel configuration so that the switching noise of the Transfergate can be canceled or reduced significantly.

SUMMARY OF THE INVENTION

This invention relates to a random access memory device which is able to store a number of binary codes of information in a Unitcell assigning multiple binary codes of information to different, assigned voltage levels in the unit storage capacitor.

Each voltage level in the storage capacitor is uniquely assigned to a different binary code, therefore the voltage at the storage capacitor can uniquely represent a number of binary codes.

Similarly to current DRAM for maintaining the voltage in the storage capacitor, refresh cycles can be implemented when the conventional value capacitor is used, having a value at the order of 100 fF using SiO2 dielectric insulator or charge in the Storage Capacitor leaks. However, if feroelectric material such as Barium Titanium Oxide, is used the refresh cycle is not always necessary.

The uniqueness of this invention of accessing the cell is that the voltage levels for the Bit-line are regulated and changed based on the LVLS over time. The time dependent voltage generator can convert binary codes to voltage levels by selecting time properly. The target voltage which is to be stored in the selected storage capacitor can be applied to the capacitor by charging or discharging though the Bit-line when the specific cell is selected by the Bit-line and by selecting the Word-line at the right time when the target voltage is applied on the Bit-line. Therefore, the target voltage which uniquely represents multiple of binary codes can be applied and then stored at the selected cell.

The number of voltage levels can be defined by the maximum voltage to the storage capacitor and the QVL. The smaller the QVL, the more levels of memory become available, but S/N ratio becomes worse because the signal is becoming smaller compared to the noise.

Thus, there exists the limitation of number of LVLs as a result of the noise to the storage capacitors. If the power supply voltage is a 5-volts system, or the QVL of 0.25 would enable 20 (5 divided by 0.3) different levels of voltage, and therefore 16 different levels of memory. Theoretically, thermal noise is Vn=kT, where kT becomes 0.0259 V at 25° C., k is the Boltzman constant and T is absolute temperature. At 150° C., kT becomes 0.078 V. The typical switching noise present in circuits utilizing prior art is approximately 1 volt, the temperature parameter threshold drift over the long term is approximately 0.07 volts, the temperature drift is approximately 0.03 volts, power supply deviation is approximately 10%, and therefore the minimum QVL for the case of the prior art, $$\sqrt{(0.078)^2 + (0.07)^2 + (0.03)^2 + (1)^2 + (0.5)^2 + (0.05)^2} = 1.124$$

V is the practical value of voltage variation. Even assuming that the noise interference problems inherent in the design of prior art could be resolved, it is not feasible to store multiple levels of voltage using prior art because the voltage variation of 1.124 V discussed above would only allow 4 levels of voltage to be stored.

This invention provides memory circuits and devices with the method and structure to store information in Unitcell reducing noise and thereby increasing the number of LVLs which increases storage capacity. By reducing noise to 0.05 V, the fraction or voltage increments achievable becomes 0.25 V, which allows 20 levels or voltage increments if a power supply of 5 V is used. Examples of different voltage levels could be 0.125, 0.375, 0.625, ... 4.875. Each voltage level is pre-assigned uniquely to a different binary bit code. For example, 0.125 volts could be assigned the 4-bit value 0000, 0.375 volts could be 0001, 0.625 volts could be 0010, and so on. The number of bits used for the code will depend on the number of voltage increments; in this example where there are 16 levels, the binary codes would be 4 bits each for a 4 V memory power supply and 8 bits for an 8 V power supply.

The voltage level is stored in the capacitor of a memory cell by selecting the cells and voltage. This invention increases the amount of data that can be stored on the same number of memory cells by factors determined by the number of voltage levels used in a particular memory circuit. In the particular example discussed above, the amount of data that can be stored using this invention is 16 times larger than the storage currently achievable with current techniques. Current SRAM memory technology only stores 1 bit of information per memory cell register using flip-flop gates and DRAM stores only 1 bit of information in the capacitor of single memory cell. If a higher voltage is used and/or if more levels of voltage are used, the storage capacity of the cells will be increased even more by implementing the charge pump circuit in the semiconductor die to increase the number of LVLs.

Figure 12A:
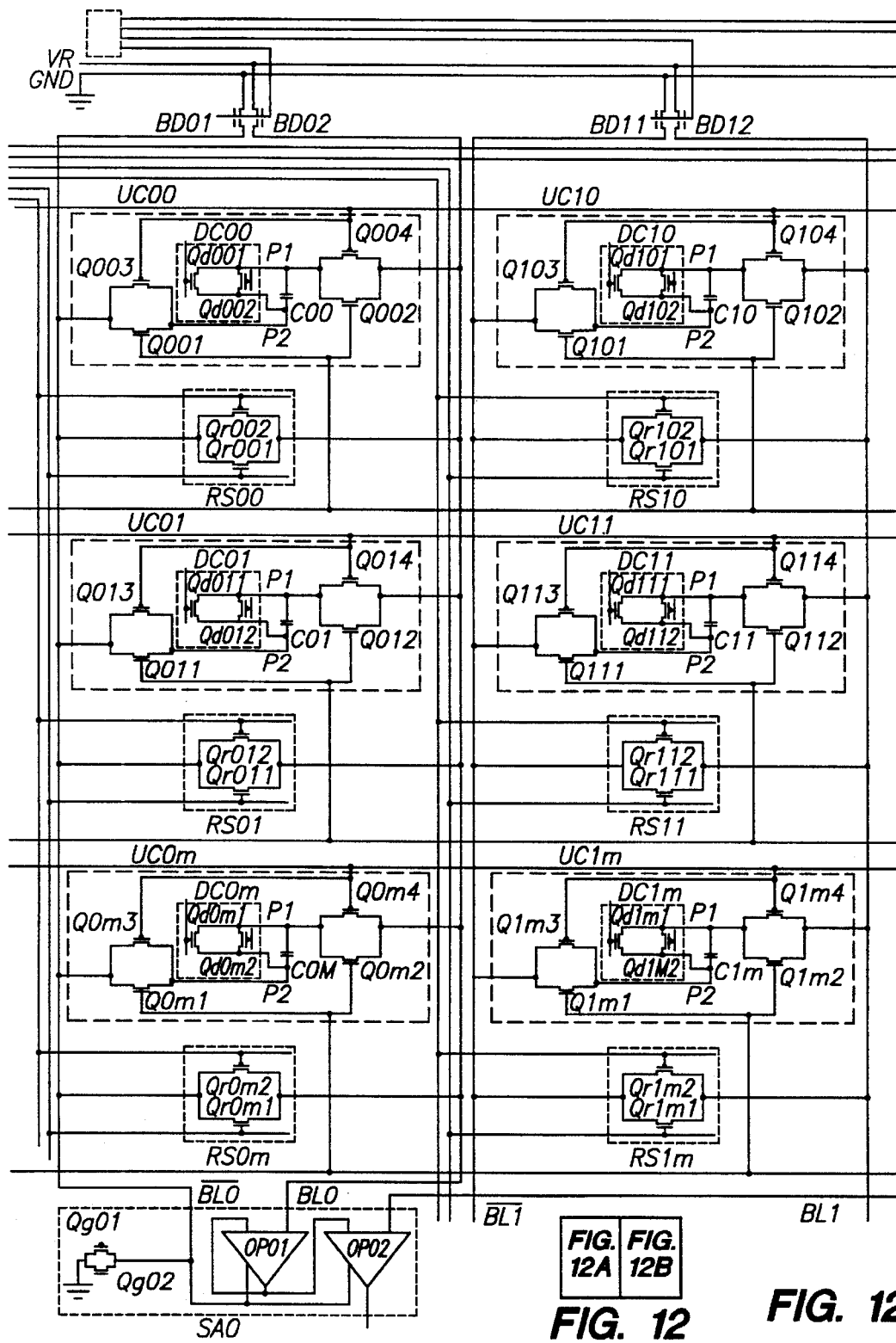
FIG. 12 illustrates a comprehensive circuit diagram of the present invented memory circuit comprising two-dimensionally, arranged array of the memory cells (UC-00, ... UCnm) which store the different voltage levels which are supplied through Bit-lines (BL0, BL0, ..., BLn; BL0,BL1, ..., $\overline{BLn}$) which are driven by Drivers (BD0, BD1, ..., BDm), and a noise cancelled Discharge-gate, comprising n-channel MOS FET Qd001 and p-channel MOS FET Qd002, which discharges the remaining charge in C00 and noise cancelled Bit-line discharge circuit comprising n-channel MOS FET Qd001 and p-channel MOS FET Qd002, which discharges the remaining charge in the stray capacitance between BL0 and $\overline{BL1}$. The cells are selected by the Word-line (WL0 ... Wm, $\overline{W0,W1}$, ..., $\overline{Wn}$) and the Bit-line (BL0, BL0, ..., $\overline{BL0,BL1}$, ..., $\overline{BLn}$) connection wires. Each Bit-line is also connected to the sense amplifier circuits, comprising prior sense amplifiers (OP01, OP011, OP021, ... ) and the comparator (OP02, OP12, OP32, ... ) to measure the voltage levels stored in the memory cells.
Figure 12B:
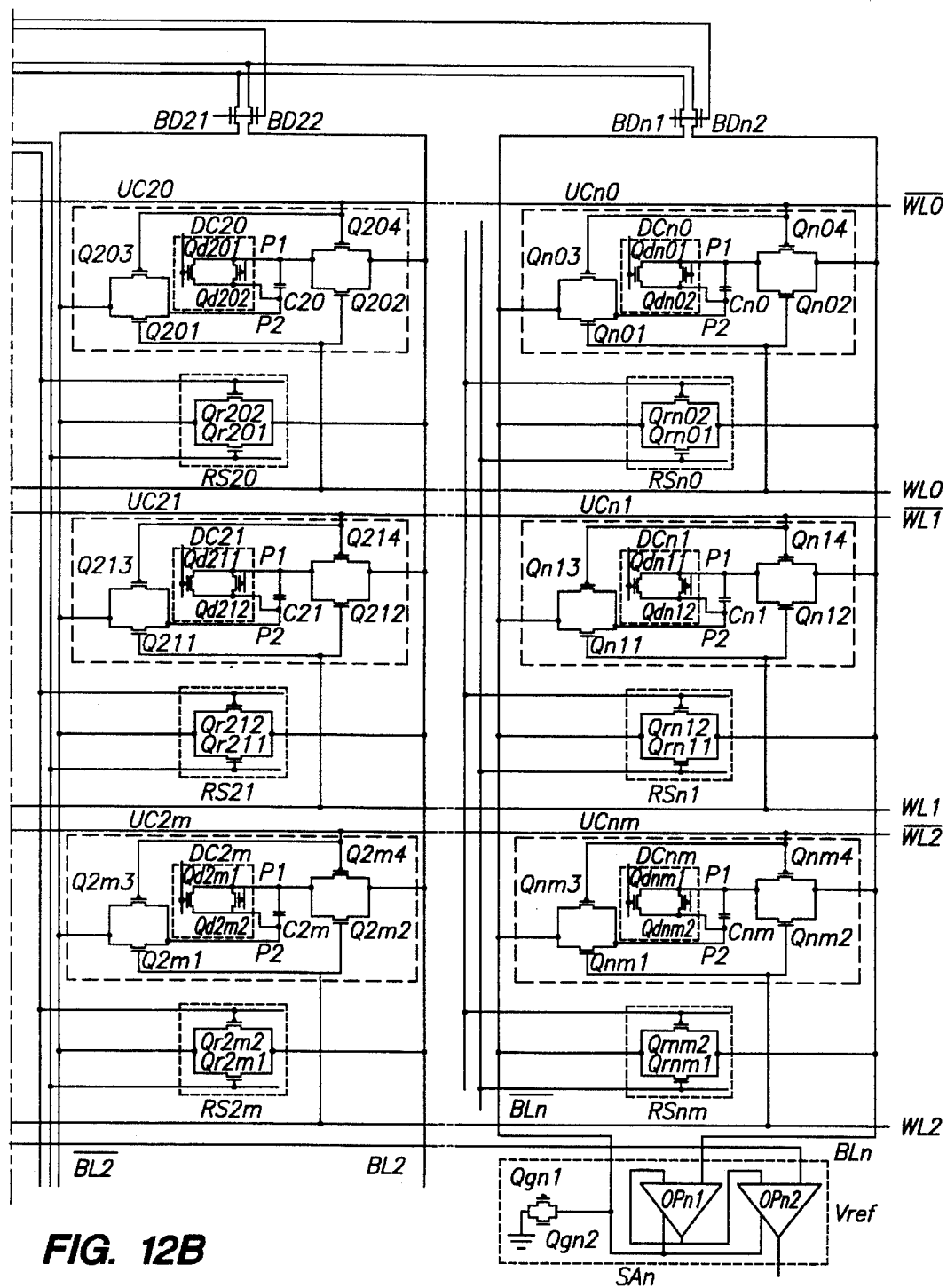
Figure 18:
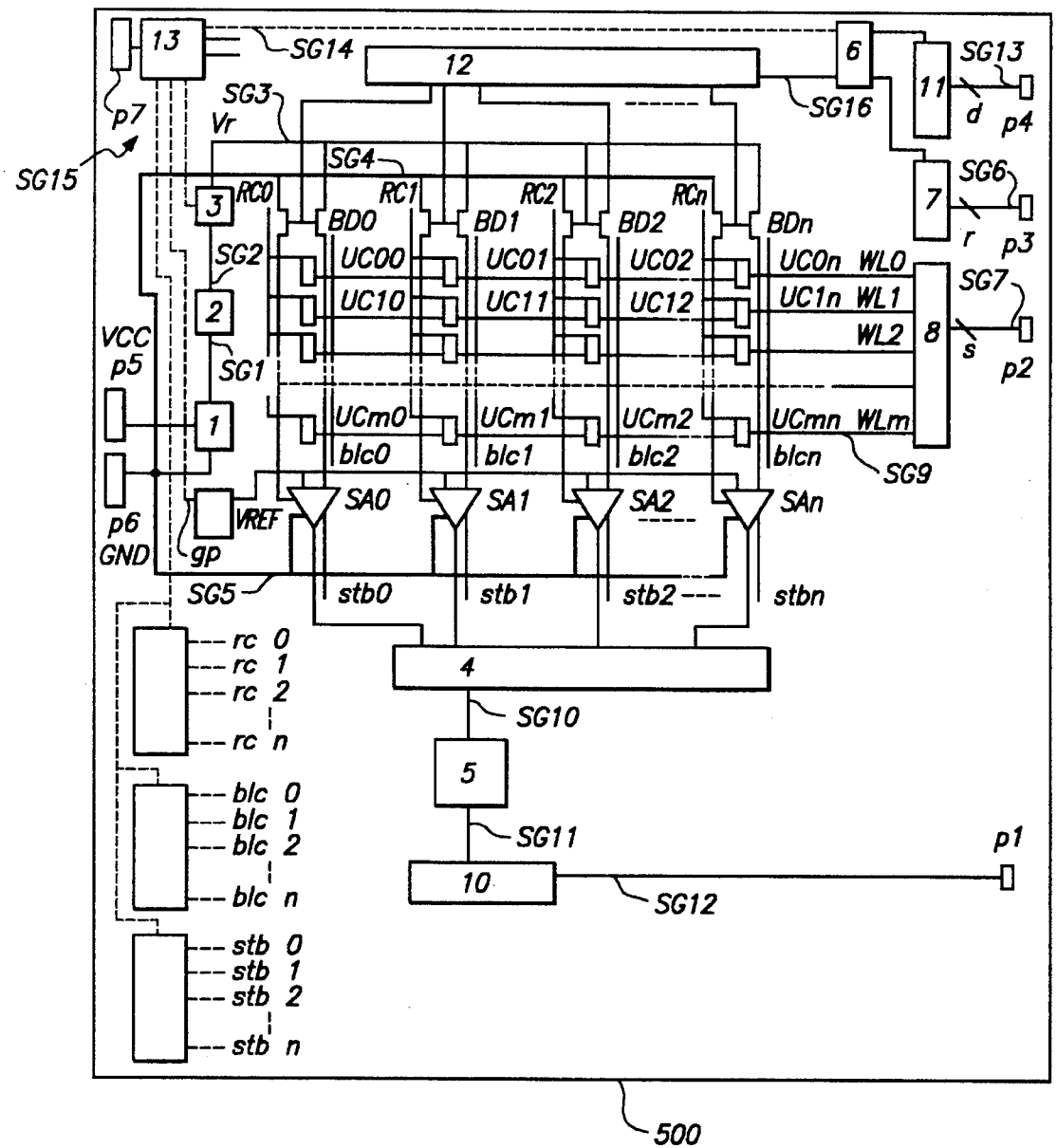
FIG. 18 illustrates the realized semiconductor circuit of FIG. 12, comprising two-dimensionally, arranged array of the memory cells (UC-00, . . . UCnm) which store the different voltage levels which are supplied through Bit-lines (BL0, BL0, ..., BLn; $\overline{BL0,BL1}$, ..., $\overline{BLn}$) which are driven by Drivers (BD0, BD1 , ..., BDm), and a noise cancelled Discharge-gate, comprising n-channel MOS FET Qd001 and p-channel MOS FET Qd002, which discharges the remaining charge in C00 and noise cancelled Bit-line discharge circuit comprising n-channel MOS FET Qd001 and p-channel MOS FET Qd002, which discharges the remaining charge in the stray capacitance between BL0 and $\overline{BL1}$. The cells are selected by the Word-line (WL0 . . . Wm, $\overline{W0},\overline{W1}, \ldots, \overline{Wn}$) and the Bit-line (BL0, BL0, . . . , BLn; $\overline{BL0},\overline{BL1}, \ldots, \overline{BLn}$) connection wires. Each Bit-line is also connected to the sense amplifier circuits (SA0, SA1, SA2 . . . SAn).
Figure 19:
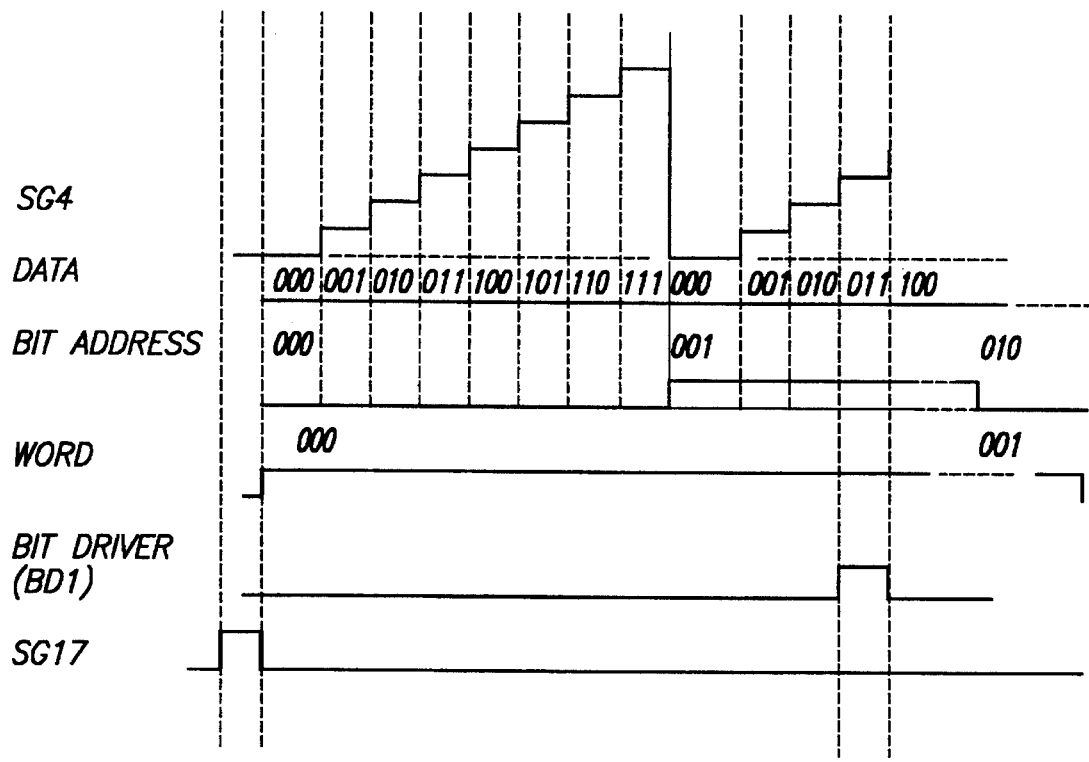

FIG. 19 illustrates the timing chart of Write-cycle of circuit diagram in FIG. 12 and semiconductor circuit in FIG. 18.

Figure 20:
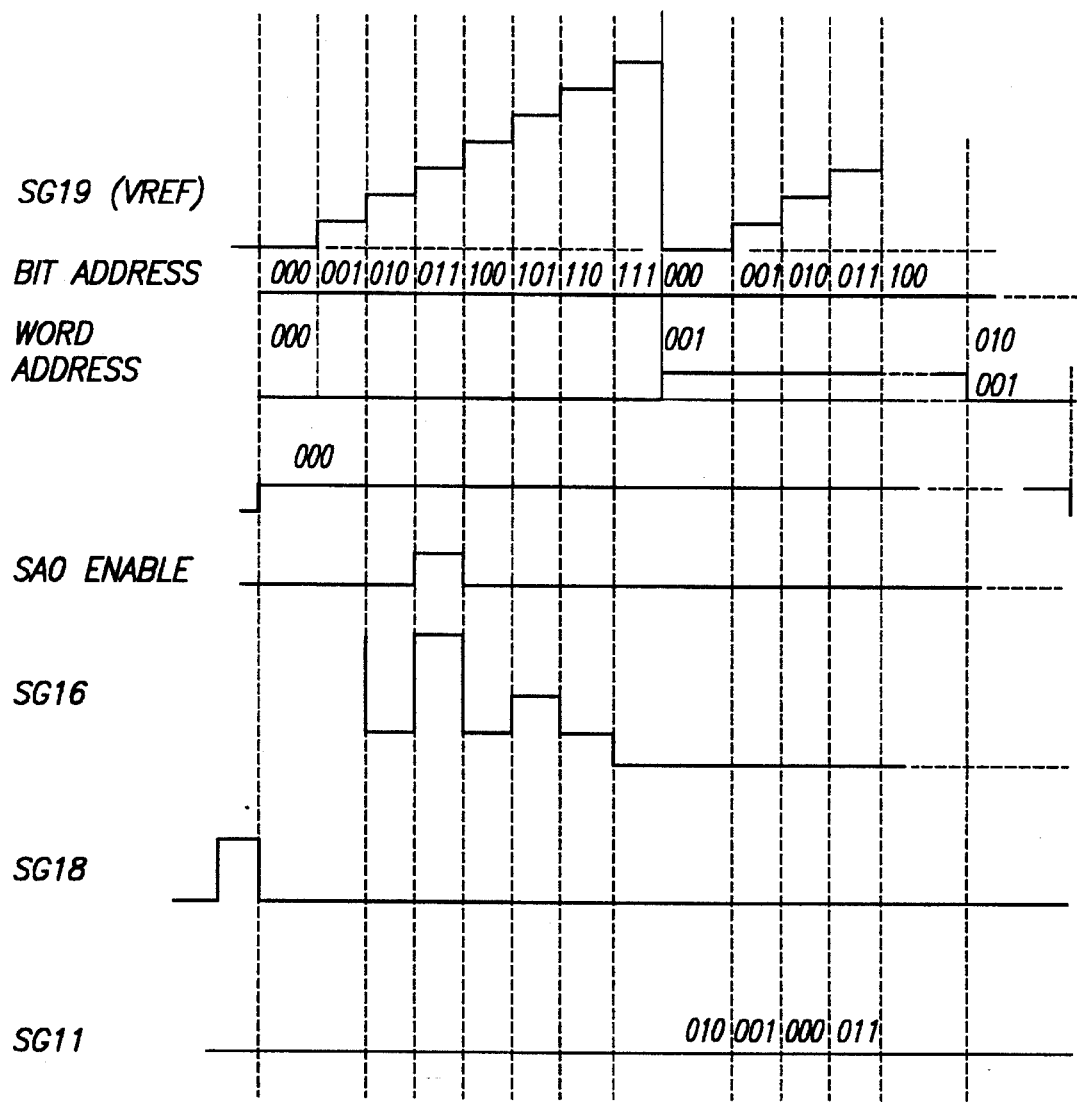

FIG. 20 illustrates the timing chart of Read-cycle of circuit diagram in FIG. 12 and semiconductor circuit in FIG. 18.

DETAILED DESCRIPTION OF PERTINANT ILLUSTRATIONS

Figure 5:
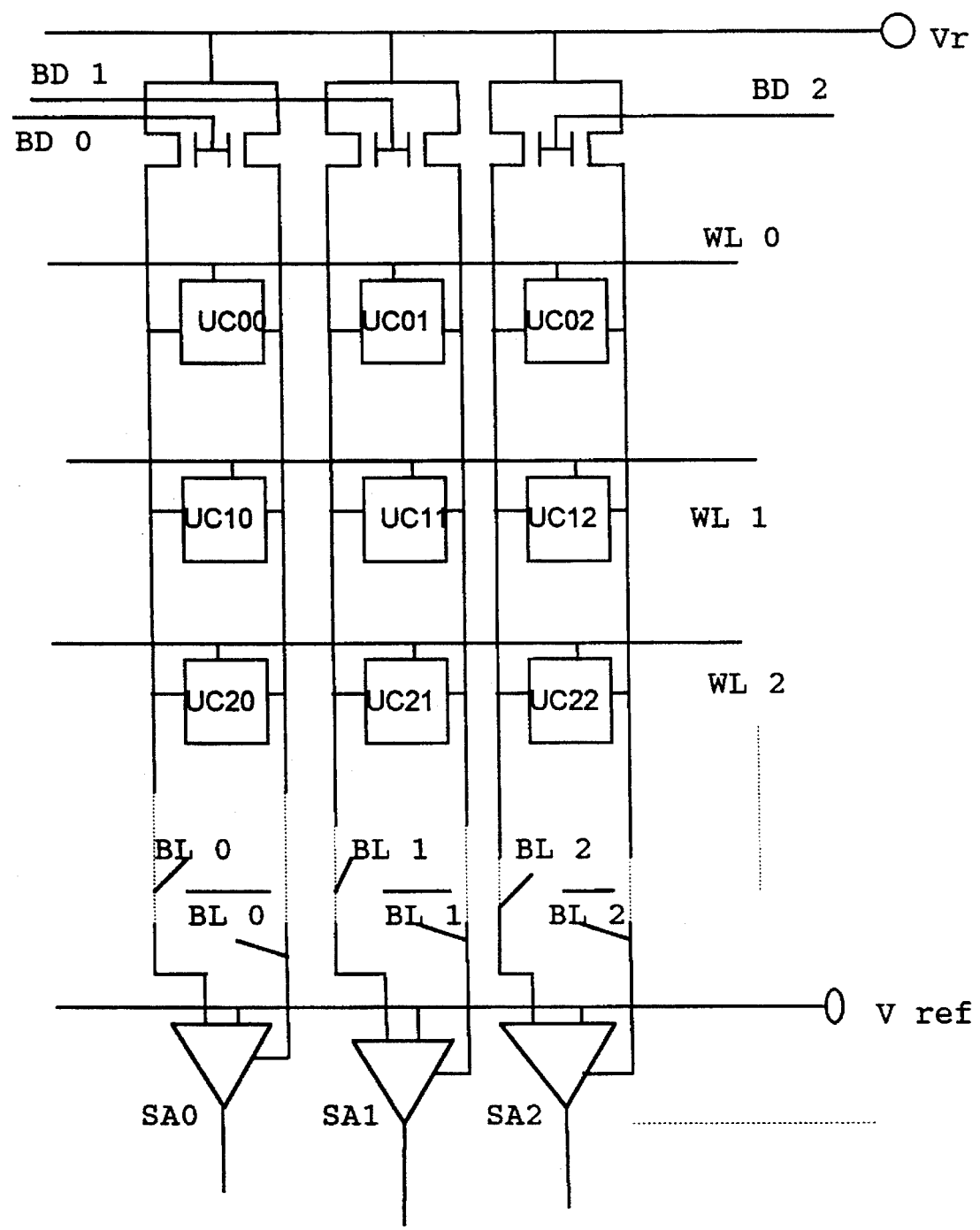
FIG. 5 illustrates a basic circuit diagram of the present invented memory circuit composed of an array of the memory cells (UC00, ... UCnm) which store the different voltages levels which are supplied through the Bit-lines (BL0, BL0, ..., BLn; $\overline{BL0},\overline{BL1},...,\overline{BLn}$) which are driven by Drivers (BD0, BD1, ..., BDm) and read by sense-amps (SA0, SA1, SA2, ..., SAn)). The cells are selected by Word-lines (WL0 ... Wm, $\overline{W0},\overline{W1},...,\overline{Wm}$) and Bit-lines (BL0, BL0, ..., BLn; $\overline{BL0},\overline{BL1},...,\overline{BLn}$) through connection wires where each Bit-line is also connected to sense-amps (SA0, SA1, SA2 ... ) to measure the voltage levels stored in the memory cells.

FIG. 5 shows the basic circuit of a comprehensive memory circuit which comprises an array of LVLS memory cells (hereafter, "LVLM") which is arranged in two dimentional ways in rows and columns. LVLSM can have multi-level states each of which represents different and unique information. Memory cells arranged in the same row are connected together by the same Bit-lines. A Bit-line has three functions:

1) Selecting a specific row out of all existing rows by driving Bit-line Driver (BLD), BD0, BD1, BD2 . . . BDn.

2) Applying LVLS to a selected row by selecting and driving Bit-line Driver (hereafter, "BLD") BD0, BD1, BD2 . . . BDn with variable voltage Vr which changes incrementally as shown in FIG. 6, where Vr, for example, changes by a 0.25 V increment versus a time domain increment starting from 0 V at t0.

3) Reading the LVLS of selected cell by selecting Sense-amps SA0, SA1, . . . .

Figure 6:
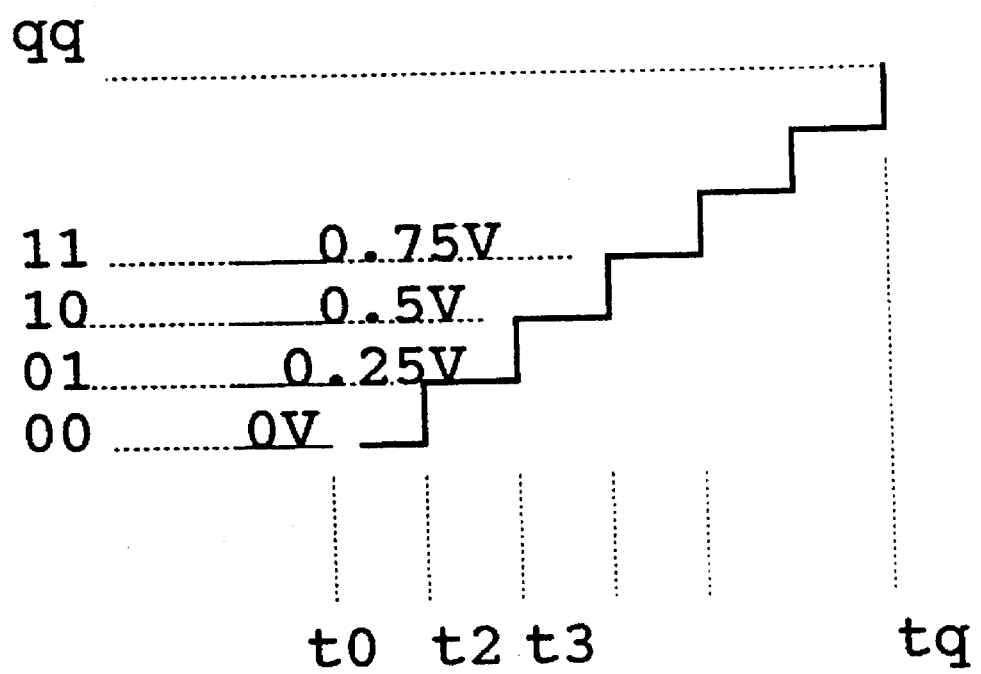
FIG. 6 is an example of the LVLS staffing from 0 V, 0.25 V, 0.5 V, ..., and 0.75 V, where "0 V" stands for binary code "00," "0.25 V" stands for "01," ..., "0.75 V" stands for "11."

The write cycle of memory cell is as follows:

If the target cell is UC11 and "10" is the data to be written on UC11, BD1 is turned on at the timing of t2 in FIG. 6 and turned off at the timing of t3 in FIG. 6. Then, 0.5 V is applied to between p1 to p2 of UC11. At the same time, WL1 becomes selecting voltage of UC11, therefore, UC11 is selected and 0.5 V is stored in UC11. The other cells which are not selected are in a floating condition: therefore there is no voltage setting to each cell.

Figure 7:
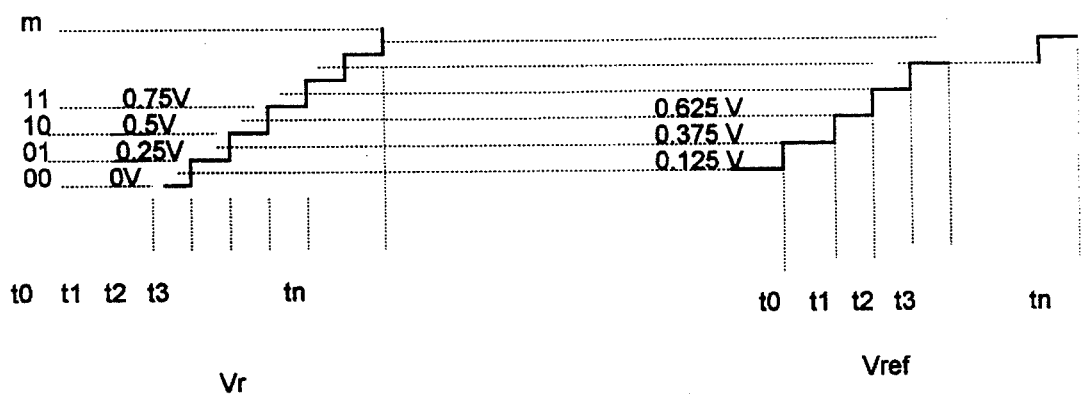
FIG. 7 shows the relationship between the LVLs Logic Levels and the threshold for the comparator to compare the stored voltage in the Storage Capacitor (hereafter, "Sense-amps") which demarcates each adjacent LVLS.

The read cycle is as follows:

If the target cell is UC11 and "10" is the stored data to be read from UC11, BD1 is in off condition, but WL1 is the selected condition and SA2 is in the condition to compare the voltage between BL0 to Vref which changes incrementally by an 0.25 V step as illustrated in FIG. 7, starting from 0.125 V. The output of SA1 changes from t2 to t3, when Vref changes from 0.375 to 0.625. Therefore, the voltage stored in UC11 can be identified as at voltage logic level 0.5 V. Two Word-lines cannot be selected simultaneously to identify only one selected out of the cells which belong to the same row, which shares the same Sense-amp, such as SA1 in FIG. 5.

Figure 1:
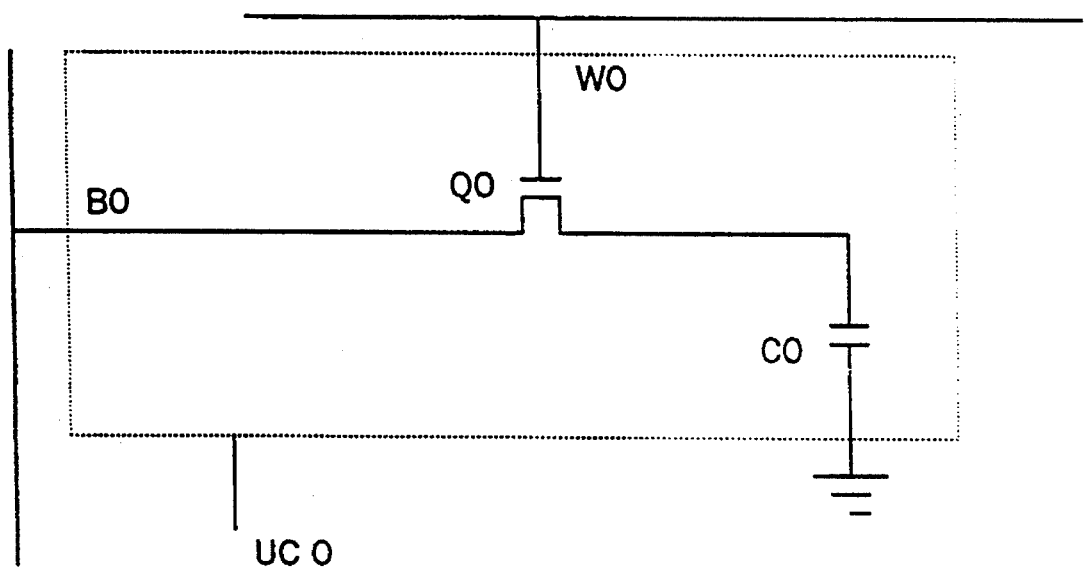
FIG. 1 is a circuit diagram showing a typical prior art memory cell of the dynamic access memory (hereafter "DRAM"), where Q0 is a transfergate, W0 is a Word line, connecting to gate of Q0 and B0 is a Bit-line, connecting to the drain of Q0, C0 is a storage capacitor and UC0 represents an Unitcell comprising the Q0, C0, B0 and W0.
Figure 2:
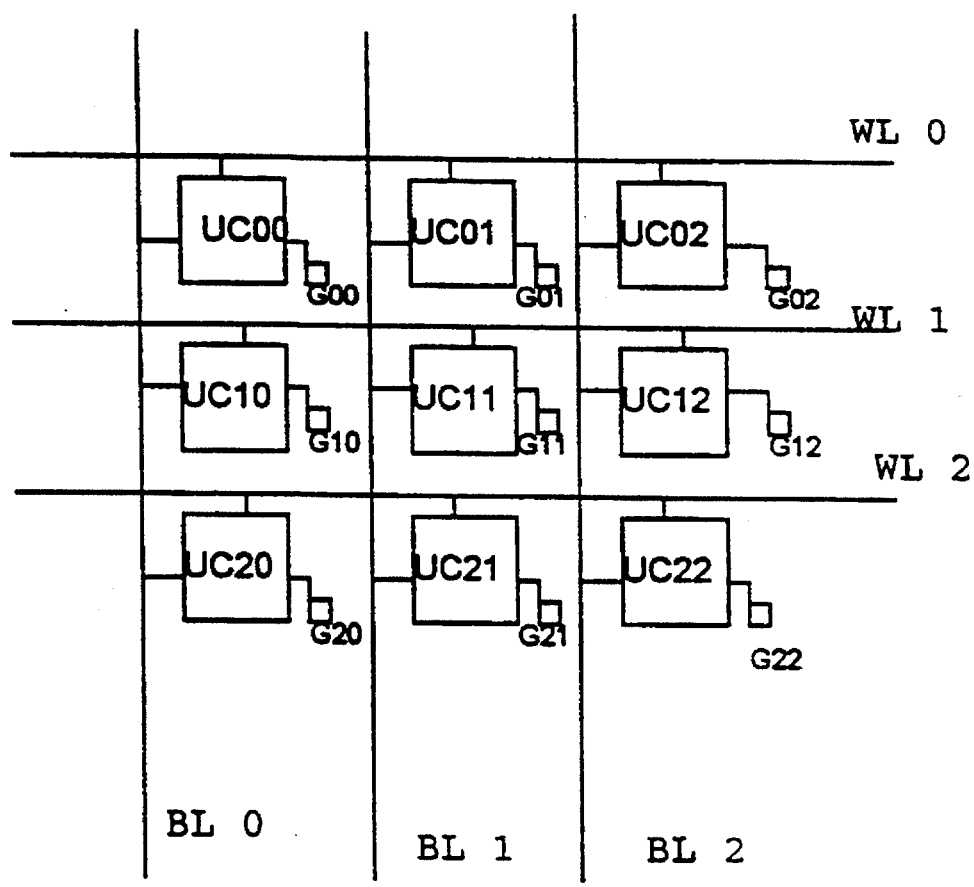
FIG. 2 is a circuit diagram which shows an array of the DRAM memory cells (UC-00, ... UCnm) arranged two dimensionally in such a way a Bit-line connects together all cells which belong to same raw and Word line which connect together all cells which belong to the same column for the purpose of selecting the target cell by selecting the related Bit-line and Word-line.
Figure 3:
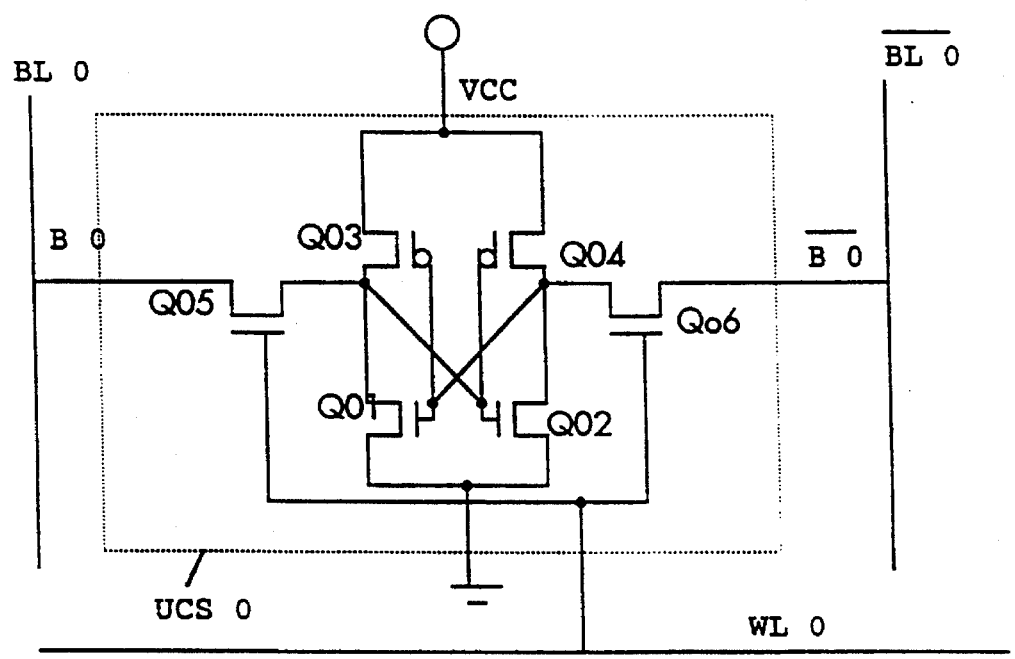
FIG. 3 is a circuit diagram showing a typical prior art for a memory cell of the static random access memory which has a flip-flop gate, where Q01 and Q02 are the switching gates, Q03 and Q04 are current sources, Q05 and Q06 are Transfergates to Bit-lines.
Figure 4:
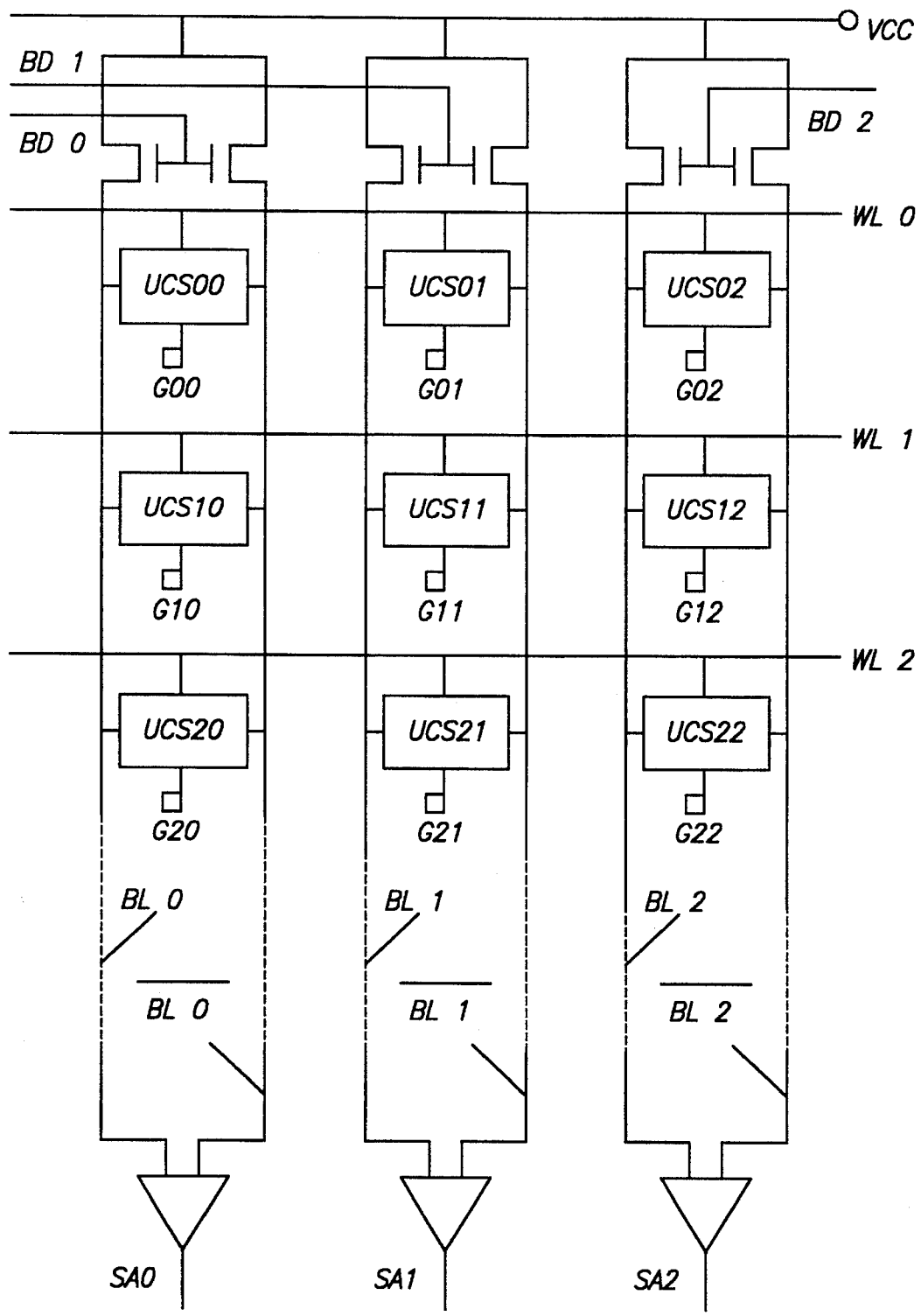
FIG. 4 is a circuit diagram which shows an array of the SRAM memory cells (UC00, ... UCnm) arranged two dimensionally in such a way as the Bit-lines (BL0, BL1, ..., BLn; $\overline{BL0},\overline{BL1},...,\overline{BLn}$), which connect together all cells which belong to the same row and the Word-line connects together all the cells which belong to the same column for the purpose of selecting the target cell by selecting the related Bit-line and Word-line.

The Unitcells of DRAM which are used in prior art, such as described in FIG. 1 and also an array of DRAM cells, such as described in FIG. 2, were unable to store multi voltage logic levels. Because the noise which is induced from gate to channel in FIG. 1 changes the voltage of capacitor C0 to an order which S/N ratio is not sufficient to have multi levels, as described in equation (1), where $\Delta Vq$ is the noise voltage at the capacitor C00 which has a capacitance of CC00 caused by the gate voltage $v_g$ change $$\frac{dv_g}{dt}$$

through Transfergate gate to channel capacitance Cg.

$$\Delta Vq = Cg \frac{dv_g}{dt} / CC00. \tag{1}$$

The other reason that an array of DRAM cells, such as described in FIG. 2, were unable to store multi-voltage logic levels is that the currents which flow through the ground pattern are normally made of the highly doped region or metal layer and shared by the ground of other memory cells for the purpose of simplifying the pattern. The ground circuit creates noise by the resistance and inductance of the ground circuit and current and current changes, as described in equation (2), where $\Delta Vg$ is noise of ground, Rg is the resistivity of ground, Lg is inductance of ground, $i_g$ is current through ground and $$\frac{di_g}{dt}$$

is change of current through ground.

$$\Delta Vg = Rg\, i + Lg \frac{di_g}{dt} \tag{2}$$

In prior art described in FIG. 2, $\Delta Vg$ in equation (2) is at an order in which S/N ratio is not sufficient to have multi-levels, such as 0.01 volts.

The objective of this invention is to decrease the noise a $\Delta Vq$ in equation (1) and $\Delta Vg$ in equation (2) to have sufficient S/N ratio of voltage at the terminals between p1 and p2 of storage capacitor, such as 0.01 volts. The basic circuit of memory cell is part of invention shown in FIG. 8, where C00 is the capacitor which stores the multi-level voltage. If the charge Q001 is stored across C00 and the capacitance of C00 is Cc00, then the voltage VC00 between p1 and p2 is shown in equation (3)

$$V_{C1} = \frac{q_1}{C_{C1}} \tag{3}$$

Because $V_{C1}$ is in proportion to Q001, V1 can be controlled or determined by controlling the quantity Q001. C00 is connected through, or located between, Transfergates Q001 and Q002 which are, in turn, connected to Bit-lines BL0 and $\overline{BL0}$. When reading the voltage across C00, Transfergates Q001 and Q002 are driven to be connective (i.e., in the "on" state). Then, each terminal p1 and p2 of C00 is connected through the Transfergates to Bit-lines BL0 and $\overline{BL0}$, which are connected to Sense-amp SA1. The bit driver BDo is in the off condition which does not supply any voltage or current through Bit-lines BL0 and $\overline{BL0}$. This state or cycle is called the Read-cycle.

When an arbitrary low impedance voltage Va is assigned across C00, C00 stores that charge Q001 from Equation (3). This procedure of storing the voltage in the capacitor is the "Write-cycle." The capacitor can be charged by turning on the Transfergates Q001 and Q002 simultaneously, at the same time supplying a low impedance voltage or a current source through the Bit-lines BL0 and $\overline{BL0}$, whose voltages are supplied by turning on bit-driver BD0, which is sourced from variable voltage source Vr. The charging or discharging current from Vr flows through BD0 and then, BL0 and BL0, across the Transfergates and into the capacitor.

At the period while C00 is not in a writing or Read-cycle, Q001 and Q002 are off, and C00 is completely disconnected from the circuit, i.e. in a floating condition. One of the inventions to improve S/N ratio is to cut off the interference (Equation (2)) from other circuit for isolating from interference from another circuit.

In prior art in FIG. 1, the storage capacitor C0 never be isolated from other circuit, it is always connected to ground. Therefore, there was interference from the current which flows though the ground as shown in equation (3).

The invention is made to provide a means measure to disconnect and isolate the storage capacitor from interference from the rest of the circuits. The method is to connect Transfergates to each terminal of the capacitor, which enables control of conductivity of the storage capacitor to Bit-lines and the ground. Thus, the invention can minimize the interference from the current or voltage noise of other memory cells or other parts of the circuit.

Figure 16:
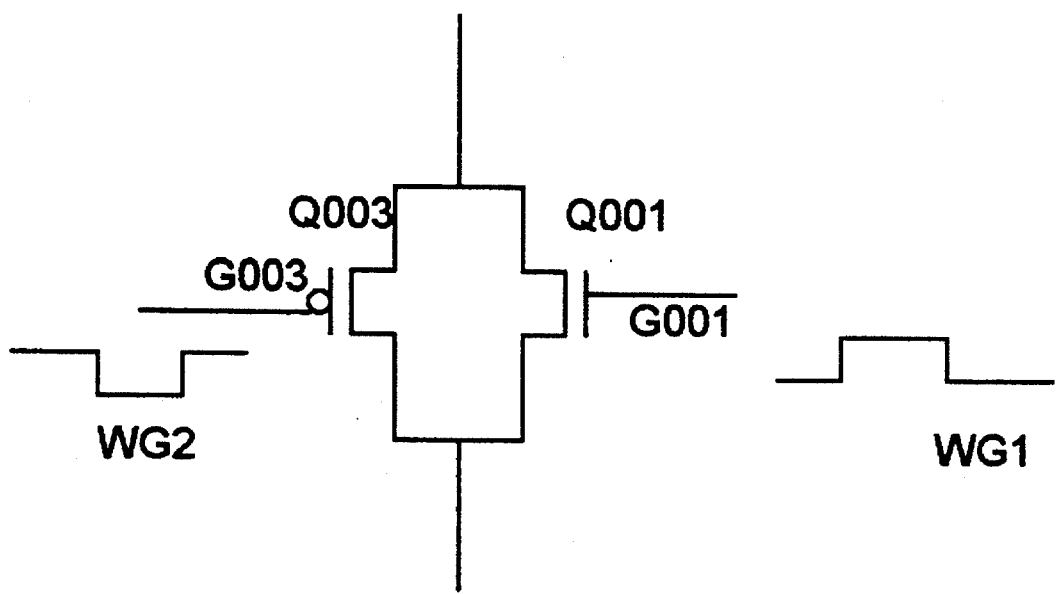
FIG. 16 illustrates a basic circuit diagram of a noise cancelling (reducing) circuit where Q001 is the n-channel MOS FET and Q002 is the p-channel MOS FET, G1 is the gate of Q001 and G2 is the gate of Q002 and WG1 is the voltage applied to G1 and WG2 is the voltage applied to G2 and $I_D$ is the drain current.
Figure 17:
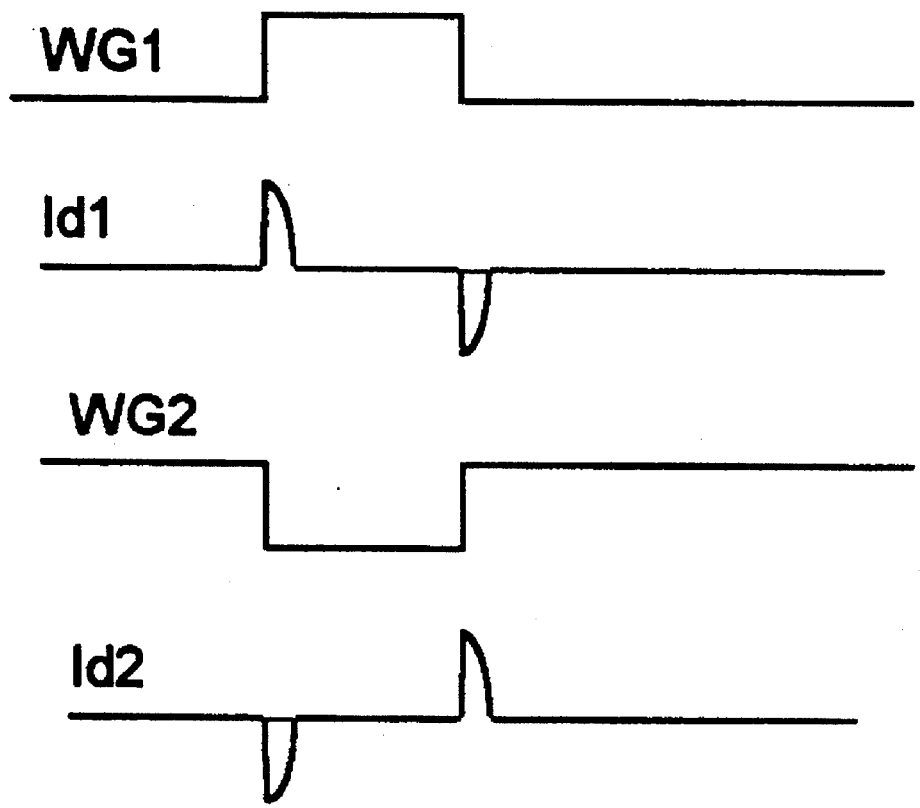
FIG. 17 illustrates the noise (voltage peaks) which are canceled (or significantly reduced) by the circuit where Id1 is the noise created by the gate channel capacitance or Q001 and 12 is the noise created by the gate channel capacitance of Q002 and where the noise of $I_D$ approaches zero.

The other invention to improve S/N ratio is to reduce the switching noise of the Transfergates, Q001 and Q002, where such interference is created by the gate-channel capacitor coupling, shown in equation (1). This invention provides the measure to reduce this kind of noise around 20 to 30 dB by using complementary Transfergates such as described in FIG. 8 and FIG. 16, where the n-channel Transfergate, Q001 and p-channel Transfergate Q003 are connected together and where the source of the n-channel MOS FET is connected to the source of the p-channel MOS FET and the drain of the n-channel MOS FET is connected to the drain of the p-channel MOS FET to form a pair of complementary Transfergates so that Q001 is turned on when the gate voltage sends a positive pulse to the source and Q002 is turned on when the gate voltage is negative. In FIG. 16, at a time when Q001 and Q002 are both on simultaneously, such as during the Write-cycle or the Read-cycle, a positive voltage is applied to G1, which is the gate of Q001, as shown as WG1 in FIG. 17, and at the same time, a negative voltage pulse is applied to G2, which is the gate of Q002, as shown by WG2 in FIG. 16. These opposite voltage swings create opposite voltage noise, as shown in FIG. 17, where Id1 is the current noise created by WG1 and Id2 is an opposite current noise created by WG2. Id1 and Id2 are canceled at the place where the source of Q002 and Q001 are connected together. In most cases, the switching noise can be reduced to less than 1%, by this invention.

Therefore, in the case of prior art to this invention, if the noise is 1 V, the present invention configuration reduces the noise to be less than 0.01 V. This noise reduction makes the voltage fluctuation much smaller: This Transfergate noise reduction feature enables the use of smaller QVLs, allowing more voltage levels which means more information can be stored.

This invention further provides a measure to improve the S/N ratio which can reset the charge remaining in C00 and the stray capacitance nearby C00, the stray capacitance between Q001, Q002, Q003, Q004, and the ground. The method is to put in a discharge circuit for C00, which discharges any charge which remains in C00 which change the voltage level stored in C00.

Figure 10:
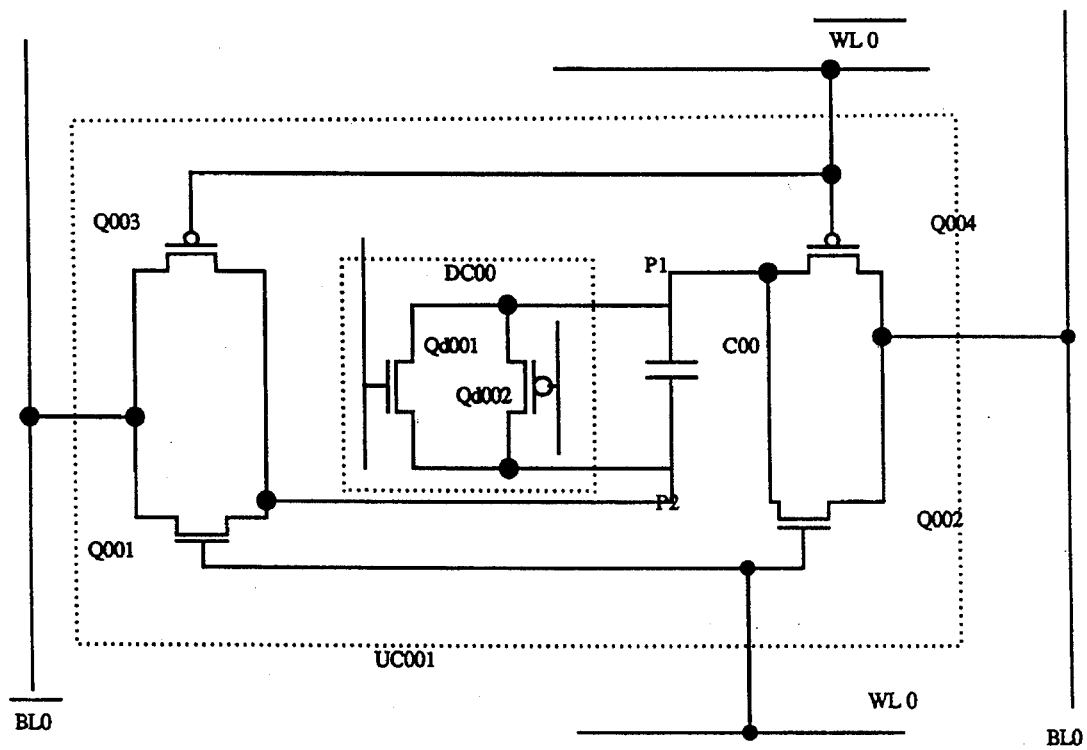
FIG. 10 illustrates the present invented memory cell with discharging Transfergate (hereafter, "Discharge-gate") comprising Storage Capacitor (C00), complementary Transfergates, composed of n-channel MOS FET Q001 and p-channel MOS FET Q003, which control the conductivity between a terminal of the Storage Capacitor (P1) and a Bit-line (BL0), and another complementary Transfergates composed of n-channel MOS FET Q002 and p-channel MOS FET Q004, which control the conductivity between a terminal of the Storage Capacitor (P2) and a Bit-line $\overline{BL1}$ (BL0), and noise canceled Discharge-gates, comprising n-channel MOS FET Qd001 and p channel MOS FET Qd002, which discharge the remaining charge in C00.

FIG. 10 shows the discharge circuit DC00, comprising a couple of complementary Transfergates formed by n-channel MOS-FET Qd001 and p-channel MOS FET Qd002. Before charging, i.e., writing to C00 though Q001 and Q002, C00 can be reset by turning on Qd001 and Qd002. Qd001 and Qd002 are made by n-channel transmission gate Qd001 and p-channel transmission gate Qd002. Therefore, the switching noise of the combined gates is very small as discussed above for the Transfergates which are shown in FIG. 16 and FIG. 17.

This invention further provides a means to improve the S/N ratio in the Bit-lines. The method is to reset the charge stored in the stray capacitance between Bit-lines BL0 and $\overline{BL0}$ by n-channel transmission gate Qd001 and p-channel transmission gate Qd002.

Figure 11:
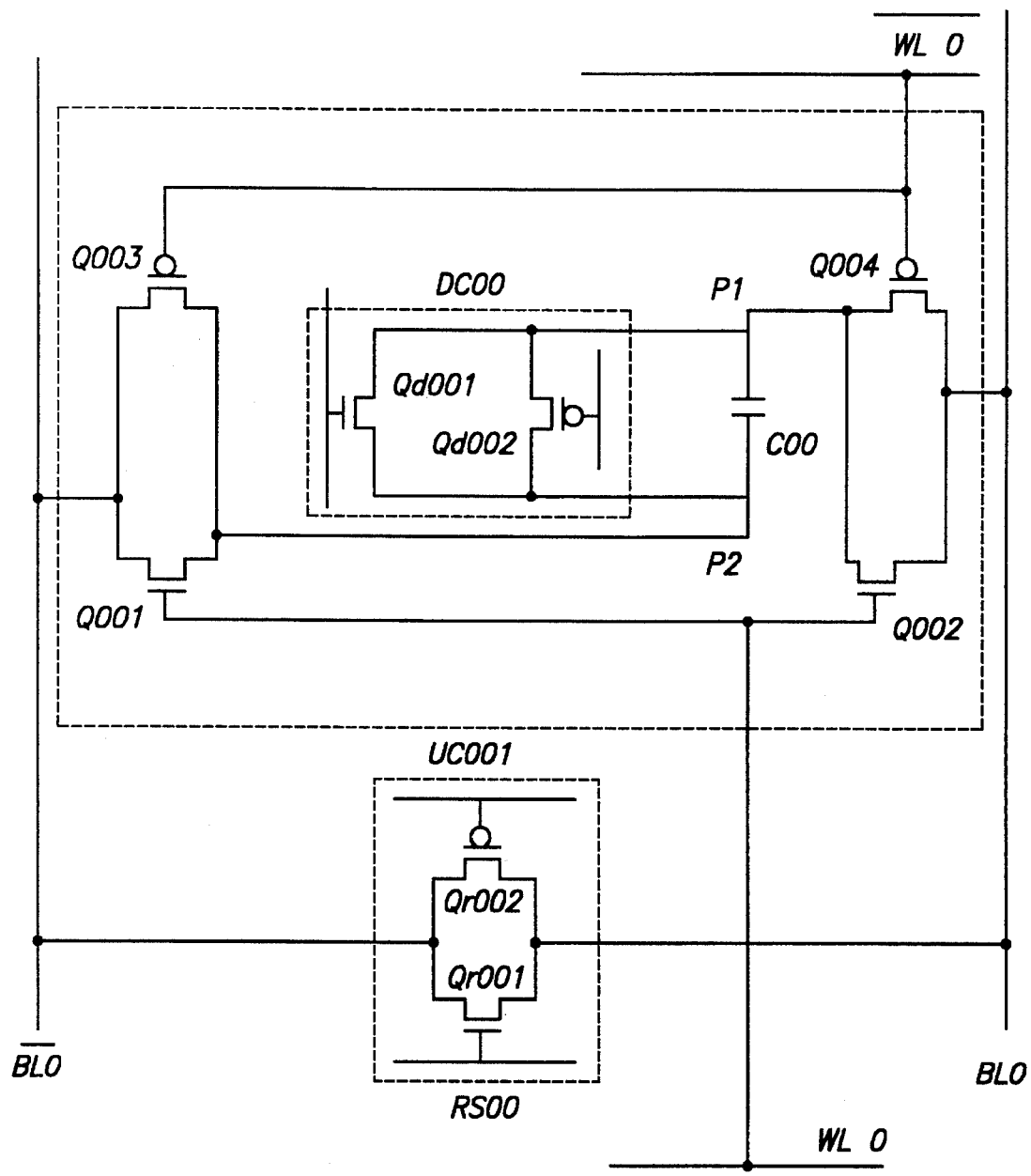
FIG. 11 illustrates the present invented memory cell composed of a Storage Capacitor (C00), complementary transfergates, consisting of n-channel MOS FET Q001 and p-channel MOS FET Q003, which control the conductivity between a terminal of the Storage Capacitor (P1) and a Bit-line (BL0), and another complementary Transfergate, comprising an n-channel MOS FET Q002 and a p-channel MOS FET Q004, which control the conductivity between a terminal of the Storage Capacitor (P2) and a Bit-line (BL1) and noise cancelled Discharge-gates, composed of a n-channel MOS FET Qd001 and a p-channel MOS FET Qd002, which discharge the remaining charge in C00 and the noise cancelled Bit-line discharge Transfergate comprising n-channel MOS FET Qd001 and p-channel MOS FET Qd002, which discharges the remaining charge in the stray capacitance between BL0 and $\overline{BL1}$.

FIG. 11 shows the reset circuit RS00 formed by n-channel Transfergate Qr1 and p-channel Transfergate Qr2. By turning on Qr1 and Qr2, the remaining charge in the storage capacitance between BL0 and $\overline{BL0}$ are discharged, before the Write-cycle and/or Read-cycle. Because Qr1 and Qr2 are formed by a complementary Transfergate, i.e., n-channel and p-channel, the switching noise is cancelled.

Figure 8:
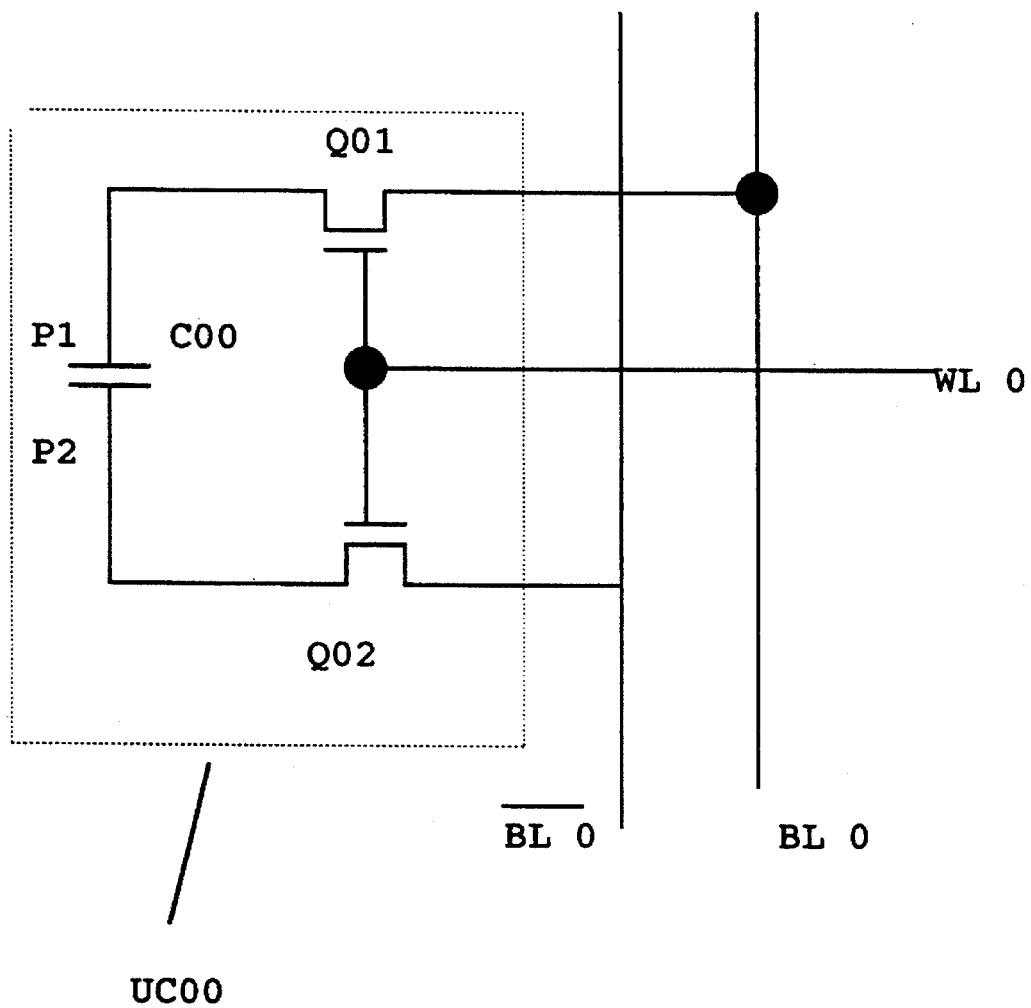
FIG. 8 illustrates a basic circuit diagram of the present invented memory cell comprising Storage Capacitor (C00), Transfergate Q001 which controls the conductivity between a terminal of the Storage Capacitor (P1) and a Bit-line (BL0) and the Transfergate Q002 which controls the conductivity between a terminal P2 of the Storage Capacitor (C00) and a Bit-line $\overline{BL0}$.

FIG. 8 shows an example of the invention comprising multiple memory cells, Bit-lines: BL00, BL01, . . . , Word-lines: WL0, WL1, . . . , Bit Drivers: BD0, BD1 , . . . , Reset Circuits RS001, RS002, . . . and Sense-amps SA0, SA1, . . .

Figure 9:
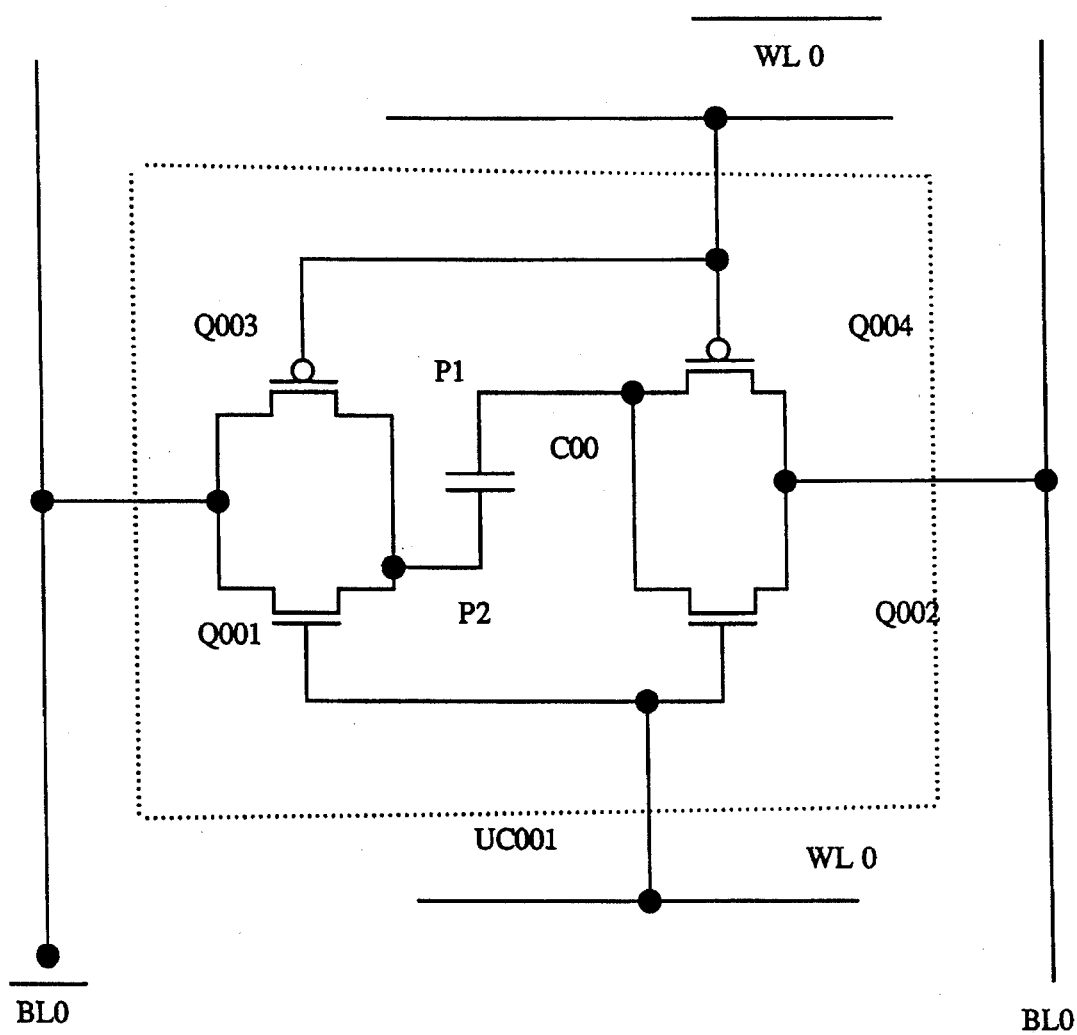
FIG. 9 illustrates the present invented memory cell with the noise-cancelled Transfergates comprising the Storage Capacitor (C00) and complementary Transfergate, comprising n-channel MOS FET Q001 and p-channel MOS FET Q003, which control the conductivity between a terminal of Storage Capacitor (P1) and Bit-line (BL0) and another Complementary Transfergates, comprising of n-channel MOS FET Q002 and p-channel MOS FET Q004, which control the conductivity between a terminal of the Storage Capacitor (P2) and a Bit-line $\overline{BL1}$.

Memory cell UC00 stands for one bit in a memory cell which has multiple levels in C001, examples of this Unitcell are described in FIG. 8, FIG. 9, and FIG. 10. In FIG. 12, a numbers of cells are arranged in an x–y array. An array of cells which belong to same row such as UC01, UC02, UC03, . . . are connected to a couple of Bit-lines, i.e., BL0 and $\overline{BL0}$. The Bit-lines are connected to Sense-amp SA0.

FIG. 12 shows the Sense-amp circuit SA0 formed by the impedance transformer OP01, comparator OP02 and ground terminator Qg01 and Qg02, where Qg01 is an n-channel transmission gate and Qg02 is a p-channel transmission gate. The ground terminator Qg01 and Qg02 come on at a time when one of the cells which belong to the same column is selected for reading the voltage in the storage capacitor.

The Read-cycle as explained as follows:

1) Turning on all reset switches RS001, RS002, . . . , which are connected to the same Bit-lines: BL0 and $\overline{BL0}$, for discharging charges which are stored in a stray capacitance between BL0 and $\overline{BL0}$. At this time, BD0 is off, Q001, Q002, Q003 and Q004 are off, DC001 is off. For example, if UC00 in FIG. 12 is selected, BD0 is off, and Qg01 and Qg02 are off.

2) After turning off RS00, RS01, . . . , and on Qg01 and Qg02, followed by Q001, Q002, Q003, Q004 to apply voltage between C00 to GS, which is connected through Qg01 and Qg02 to the ground. The method of turning on Q001, Q002, Q003 and Q004 is to select the Word-line. The first row of cells UC00, UC10, . . . are connected by Word-line WL0 and $\overline{W0}$, the second row of cells UC01, UC11 . . . are connected by WL1 and $\overline{W1}$, etc. Then, UC00 is selected by WL0 and $\overline{W0}$ by applying a positive pulse to WL0 and applying negative voltage to $\overline{W0}$.

3) At the time when Qg01 and Qg02 are on, one of the terminals of C00 is grounded though $\overline{BL0}$ at the place GS (FIG. 11) which is nearby OP01 then The voltage of C00 then goes to B2 of OP01 and output voltage of OP01, (E1 in FIG. 11) becomes the same voltage as C001. The voltage of E1 is then compared by OP02 with the changing voltage Vref such as shown in FIG. 6. If the voltage of E1 is 0.5, i.e., the voltage of C00 is 0.5, then the output of OP02, i.e., E2, is negative until t2 and becomes positive after t2.

At the Write-cycle, if UC00 is selected, the writing sequence will be as follows.

1) Discharge C00 by turning on Discharge-gate DC00 in FIG. 12, comprising Qd001 and Qd002 to discharge the remaining charge in C00 at UC00, at the same time turn on Reset-gate RS00, RS01, . . . , which are connected between Bit-lines BL0 and $\overline{BL0}$.

2) Turn off, the Discharge-gate DC00 and Reset-gate, and then turn on BD0, which drives BL00 and $\overline{BL0}$, for supplying selected voltage Vr to C00 by selecting the time. At the same time, select Q001, Q002, Q003 and Q004 to supply Vr to C001. In this Write-cycle, Qg01 and Qg02 are kept off.

3) Apply the LVLS shown in FIG. 6 at the appropriate time to the Bit-line driver BD0, BD1, BD2, . . . which drives the Bit-lines BL00, BL01, . . . , $\overline{BL00},\overline{BL01}$. Therefore, by selecting arbitrary Word-line WL0, WL1, . . . and $\overline{W0},\overline{W1}$ . . . , arbitrary voltage, i.e. data can be stored in C00.

In FIG. 11, if the binary data "10" is to be stored in memory cell UC00, at time t2 (of FIG. 6) when the voltage Vr is 0.5 V, turn on BD0 to supply Vr to BL00 and $\overline{BL00}$. At the same time, WL0 becomes positive and $\overline{W0}$ becomes negative, therefore, Q001, Q002, Q003, Q004 come on, then the current flows from Vr through BD0 and Q001, Q002, Q003, Q004 to C00.

In the same time increment from t1 to tn, the desired voltage corresponding to the binary code can be stored in other cells UC01, UC02, B03 . . . at the specific time corresponding to the binary code to be stored, by applying a positive pulse on WL1, W2, . . . and $\overline{W1},\overline{W2}$ . . . . At this writing cycle, Qg01 and Qg02 are off.

Figure 13:
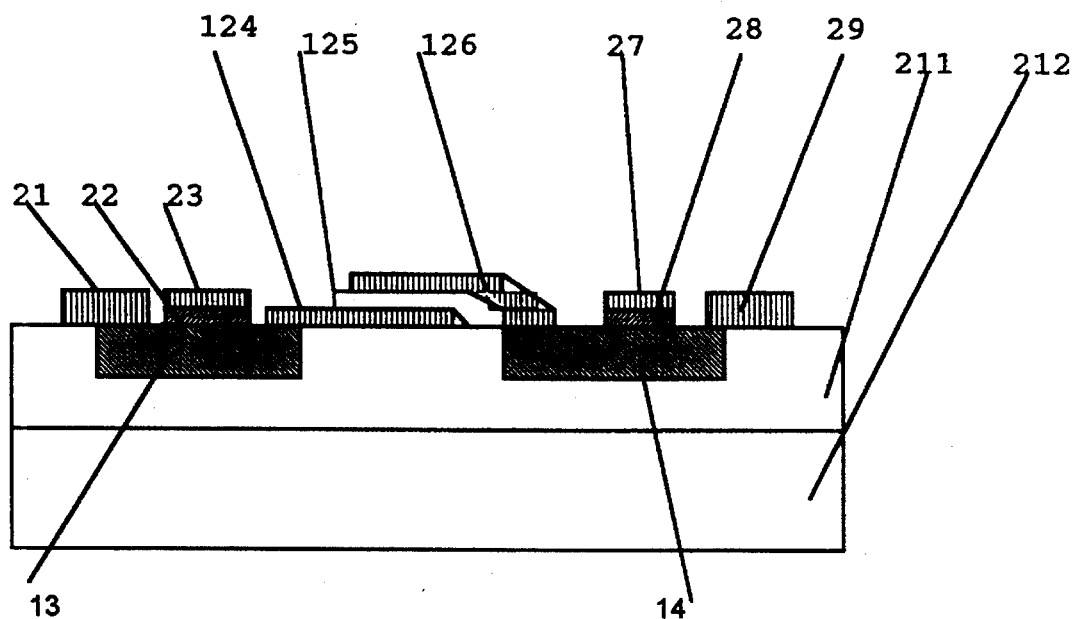
FIG. 13 is an illustration of a cross section of the realized invention using a semiconductor structure which illustrates a stacked capacitor, formed by an under layer conductor 124, dielectric layer 125 and covering conductive layer 126, a Transfergate 13, where its source or drain is connected to the the conduor 124 and the other terminal of Transfergate 13 is connected to conductor layer 21, and the source or drain of Transfergate 14 is connected to conductor layer 26, where the other terminal of Transfergate 14 is connected to conductive layer 29 on the epitaxied layer 211 on the silicon single crystal wafer 212.

The circuit diagram in FIG. 8 is an example of realized circuit which is realized as a semiconductor integrated circuit shown in FIG. 13. FIG. 13 shows the cross section of a semiconductor memory device, where 124 is the electrode to form the Storage Capacitor C00 in FIG. 8, with insulator 125 and the other electrode 126, which is covering insulator 125, made of $SiO_2$, $Ta_2O_5$, $Ni_2O_3$, Titanium Barium Oxide, or any dielectric material, and insulated from the electrode 124, forming a Storage Capacitor C00 in FIG. 8.

Figure 14:
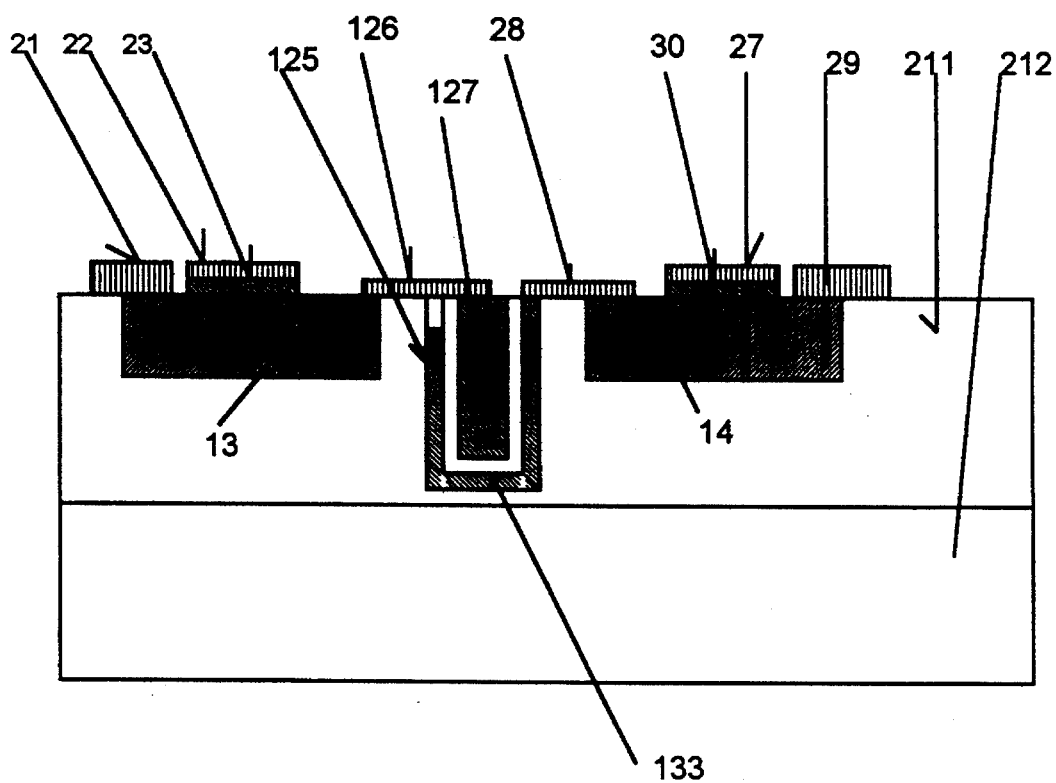
FIG. 14 is an illustration of a cross section of the present invention using a semiconductor process which illustrates a trenched capacitor formed by an under layer conductor 125, dielectric layer 133 and covering conductive layer 127 where its source or drain is connected to the conductor 124 and the other terminal of Transfergate 13 is connected to conductor layer 21, and the source or drain of Transfergate 14 is connected to conductor layer 126, where the other terminal of Transfergate 14 is connected to conductive layer 29 on the epitaxied layer 211 on the silicon single crystal wafer 212.

In FIG. 14, 13 is the p-doped region to form a n-channel MOS FET of Q001 in FIG. 8, whose gate insulator 22 can be made of $SiO_2$|, the gate 23 of Transfergate can be made of aluminum, copper, tungsten or polysilicon, the source terminal 21, can be made of aluminum, copper, tungsten or polysilicon, and in the same manner, the p-channel FET, which is Q002 in FIG. 8, can be formed in n-doped region 14, where 28 is the gate insulator, made of $SiO_2$, and 29 is the drain terminal.

In FIG. 8, the n-channel transmission gate which is an n-channel MOS FET is used, however, instead of using an n-channel MOS-FET, a p-channel MOS-FET can be used, where a p-channel MOS-FET can be formed in n-doped region.

FIG. 14 shows the another realization of the FIG. 8 circuit, which is the same as in FIG. 13 except for the storage capacitor C00. In FIG. 14, the storage capacitor is formed by an embedded electrode 25, an embedded insulator 33, and an other embedded electrode 27. This formation is normally called as trench capacitor. 126 is the conductive layer connecting drain of MOS FET 13 and the other electrode 127 of capacitor. 28 is the conductive pattern which connects the electrode 125 and the source of MOS FET 29. In FIG. 14, insulator 133 can be made of $SiO_2$, $Ta_2O_5$, $Ni_2O_3$, Titanium Barium Oxide, or polymer or any dielectric material.

Figure 15A:
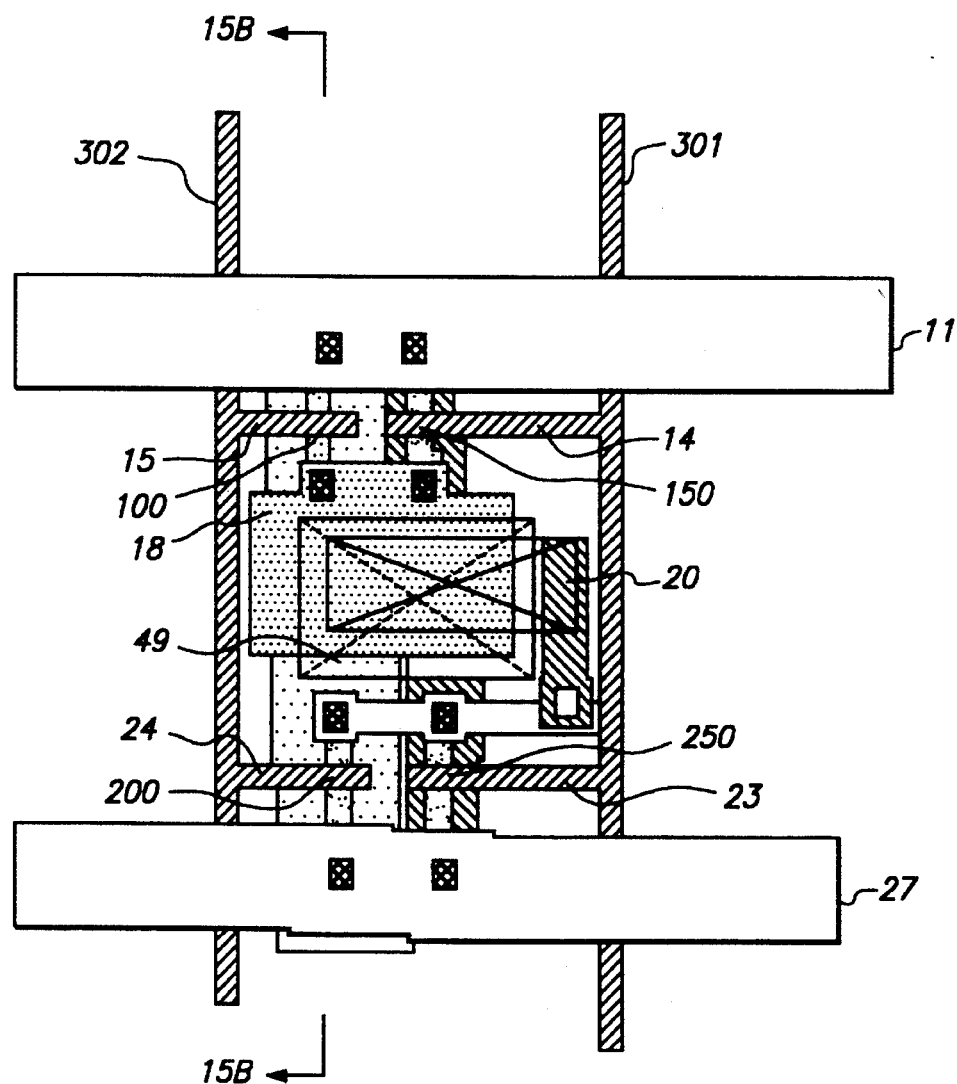
FIG. 15a is a top view of a semiconductor device layout diagram showing the realized structure of FIG. 9 with the stacked capacitor, comprising an under layer conductor 18, insulator 19 and covering conductor 20 and one set of noise Canceled Transfergates, comprising of n-channel MOS FET 150 and p-channel MOS FET 100 and an other set of noise canceled Transfergates, comprising n-channel MOS FET 250 and p-channel MOS FET 200; Bit-lines 11 and 27; Word-lines 301 and 302.
Figure 15B:
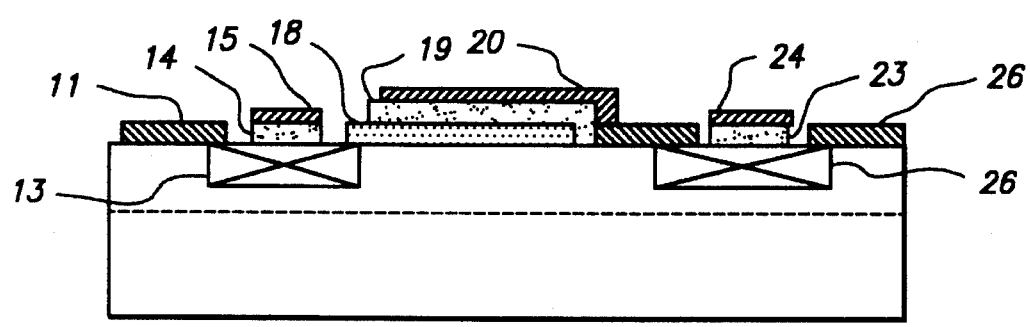
FIG. 15b shows the side view or cross section of FIG. 16 which illustrates a stacked capacitor formed by the under layer conductor 125, dielectric layer 133 and covering conductive layer 127 where its source or drain is connected to the conductor 127 and the other terminal of Transfergate 13 is connected to conductor layer 11, and the source or drain of the other Transfergate 14 is connected to the conductor layer 126, where the other terminal of Transfergate 25 is connected the to conductive layer 127 on the epitaxied layer 28 on the silicon single crystal wafer 29.

FIG. 15 shows the realized device of the circuit diagram in FIG. 9. In FIG. 15, 100, 200 are the n-channel MOS FETs and 150 and 250 are the p-channel MOS FETs, 18 is the electrode for the storage capacitor, which is formed by electrode 17 and insulator 19 and an other electrode 20, that is connected to the drain of FETs, 200, 250.

FIG. 18 shows the realized circuit diagram of FIG. 12. However, FIG. 18 includes more realized functions. The block diagram circuit in FIG. 18 includes:

1) An array of memory cells, UC00, UC01, UC02, . . . , UC0m, UCn0, UCn1, . . . UCnm. which are arranged two dimensionally in n+1 by m+1.

2) Bit-drivers BD0, BD1, BD2, . . . , BDn which drives each Bit-line.

3) Sense-amps SA0, SA1, SA2, . . . , SAn.

4) The charge pump circuit 1 which increases the voltage from Vcc (3 to 5 volts) to a higher voltage, such as 20 to 100 volts.

5) The timing generator 13 which provides the necessary timing and pulse to control the circuit, such as the incremented step voltage generator 3, serial parallel timing controller 6, storage capacitor reset pulse generator, the Bit-line reset pulse generator, Sense-amp probe pulse generator.

6) Shift registers 10, 11, 7 and 12.

7) Analog multiplexers 4.

8) Analog/digital converter 5.

The Write-cycle operation of FIG. 18 is described in FIG. 19 and the Read-cycle operation of FIG. 18 is described in FIG. 20.

In a Write-cycle, if it is necessary to reset the remaining charge in the storage capacitor C001 in FIG. 12, reset the storage capacitor in the cell by applying a pulse, shown in FIG. 20. If the data (001) is assigned to be stored at bit address (001) and word address (000), bit drive voltage Vr (SG4) changes incrementally by quantumized voltage, such as 0.25 volts, as shown in FIG. 20. In FIG. 20, when the bit address is (001), the word address is (000) and the data is (011), then the bit driver (BD1) can be selected between $t_s$ and $t_{s+1}$ by the timing circuit 6 and shift register 12 in FIG. 19, while the word select signal line WL0 is selected. Then, because the data (011) corresponds 0.75 volts at the timing $t_s$, data 0.75 volts can be stored in UC01.

In a Read-cycle, if the data at bit address (010) and word address (001) is assigned to be read, WL0 is selected by the timing circuit 8, composed of the shift register, and SA0 is selected by another timing circuit 14, comprising the shift register, and distributes the strobe pulse to select SA0.

By selecting WL0, complementary Transfergates Q001, Q002, Q003 and Q004 are turned on, while Qd01, Qd02 are off, BD0 is off and Qr001, Qr002 . . . are off in FIG. 12. The selection of SA0 is done by turning on the complementary Transfergate Qg01 and Qg02 in FIG. 12. The analog multiplexer selects the signal from SA0, then the selected analog signal SG10 in FIG. 18 is converted to binary code by the A/D converter 5. The output is registered in shift register 10.

The Read-cycle timing is shown in FIG. 20.

I claim:

1. A memory cell for storing a plurality of bits of information, comprising:

a storage capacitor capable of storing one of more than two different voltage levels, said capacitor having a first terminal and a second terminal; and a first switching element having a coupling terminal coupled to the first terminal of said capacitor, and a data terminal coupled to a conductive line, for selectively coupling said capacitor to said conductive line, said switching element generating at least two sets of noise signals when coupling said capacitor to said conductive line which substantially cancel out each other.

2. The memory cell of claim 1, further comprising:

a second switching element coupled to the second terminal of said capacitor, said second switching element selectively electrically isolating said capacitor from noise generated by other components.

3. A memory cell for storing a plurality of bits of information, comprising:
   a storage capacitor capable of storing one of more than two different voltage levels, said capacitor having a first terminal and a second terminal;
   a first switching element having a coupling terminal coupled to the first terminal of said capacitor, and a data terminal coupled to a conductive line, for selectively coupling said capacitor to said conductive line, said switching element generating at least two sets of noise signals when coupling said capacitor to said conductive line which substantially cancel out each other; and
   a second switching element, comprising:
      an n-channel MOSFET having a drain terminal coupled to the second terminal of said capacitor, a source terminal coupled to an external node, and a gate terminal for receiving a first isolate control signal; and
      a p-channel MOSFET having a drain terminal coupled to the second terminal of said capacitor, a source terminal coupled said external node, and a gate terminal for receiving a second isolate control signal.

4. A memory cell for storing a plurality of bits of information, comprising:
   a storage capacitor capable of storing one of more than two different voltage levels, said capacitor having a first terminal and a second terminal;
   a first switching element having a coupling terminal coupled to the first terminal of said capacitor, and a data terminal coupled to a conductive line, for selectively coupling said capacitor to said conductive line, said switching element generating at least two sets of noise signals when coupling said capacitor to said conductive line which substantially cancel out each other; and
   a discharge switching element coupled to the first and second terminals of said capacitor for selectively discharging said capacitor.

5. The memory cell of claim 4, wherein said discharge switching element comprises:
   an n-channel MOSFET having a drain terminal coupled to the first terminal of said capacitor, a source terminal coupled to the second terminal of said capacitor, and a gate terminal for receiving a first reset control signal; and
   a p-channel MOSFET having a drain terminal coupled to the first terminal of said capacitor, a source terminal coupled to the second terminal of said capacitor, and a gate terminal for receiving a second reset control signal.

6. A memory cell for storing a plurality of bits of information, comprising:
   a storage capacitor capable of storing one of more than two different voltage levels, said capacitor having a first terminal and a second terminal; and
   a first switching element, comprising:
      a switching component, coupled to both a conductive line and the first terminal of said capacitor, for selectively coupling said conductive line to said capacitor in response to a first control signal, said switching component generating a set of noise signals when coupling said conductive line to said capacitor; and
      a complementary switching component, coupled to both said conductive line and the first terminal of said capacitor, for selectively coupling said conductive line to said capacitor in response to a second control signal, said complementary switching component generating a complementary set of noise signals when coupling said conductive line to said capacitor which substantially cancels out the set of noise signals generated by said switching component.

7. The memory cell of claim 6, further comprising:
   a second switching element coupled to the second terminal of said capacitor, said second switching element selectively electrically isolating said capacitor from noise generated by other components.

8. The memory cell of claim 7, wherein said second switching element comprises:
   an n-channel MOSFET having a drain terminal coupled to the second terminal of said capacitor, a source terminal coupled to an external node, and a gate terminal for receiving a first isolate control signal; and
   a p-channel MOSFET having a drain terminal coupled to the second terminal of said capacitor, a source terminal coupled said external node, and a gate terminal for receiving a second isolate control signal.

9. The memory cell of claim 6, further comprising:
   a discharge switching element coupled to the first and second terminals of said capacitor for selectively discharging said capacitor.

10. The memory cell of claim 9, wherein said discharge switching element comprises:
    an n-channel MOSFET having a drain terminal coupled to the first terminal of said capacitor, a source terminal coupled to the second terminal of said capacitor, and a gate terminal for receiving a first reset control signal; and
    a p-channel MOSFET having a drain terminal coupled to the first terminal of said capacitor, a source terminal coupled to the second terminal of said capacitor, and a gate terminal for receiving a second reset control signal.

11. A memory cell for storing a plurality of bits of information, comprising:
    a storage capacitor capable of storing one of more than two different voltage levels, said capacitor having a first terminal and a second terminal; and
    a first switching element, comprising:
       an n-channel MOSFET having a drain terminal coupled to a conductive line, a source terminal coupled to the first terminal of said capacitor, and a gate terminal for receiving a first control signal, said n-channel MOSFET generating a set of noise signals when coupling said conductive line to said capacitor in response to said first control signal; and
       a p-channel MOSFET having a drain terminal coupled to said conductive line, a source terminal coupled to the first terminal of said capacitor, and a gate terminal for receiving a second control signal, said p-channel MOSFET generating a complementary set of noise signals when coupling said conductive line to said capacitor in response to said second control signal, said complementary set of noise signals substantially canceling out the set of noise signals generated by said n-channel MOSFET.

12. The memory cell of claim 11, wherein said first and second control signals are inverses of each other.

13. The memory cell of claim 11, further comprising:

a second switching element coupled to the second terminal of said capacitor, said second switching element selectively electrically isolating said capacitor from noise generated by other components.

14. The memory cell of claim 13, wherein said second switching element comprises:

an n-channel MOSFET having a drain terminal coupled to the second terminal of said capacitor, a source terminal coupled to an external node, and a gate terminal for receiving a first isolate control signal; and a p-channel MOSFET having a drain terminal coupled to the second terminal of said capacitor, a source terminal coupled said external node, and a gate terminal for receiving a second isolate control signal.

15. The memory cell of claim 11, further comprising:

a discharge switching element coupled to the first and second terminals of said capacitor for selectively discharging said capacitor.

16. The memory cell of claim 15, wherein said discharge switching element comprises:

an n-channel MOSFET having a drain terminal coupled to the first terminal of said capacitor, a source terminal coupled to the second terminal of said capacitor, and a gate terminal for receiving a first reset control signal; and a p-channel MOSFET having a drain terminal coupled to the first terminal of said capacitor, a source terminal coupled to the second terminal of said capacitor, and a gate terminal for receiving a second reset control signal.

17. A semiconductor memory device, comprising:

at least one memory cell capable of storing a plurality of bits of information, said memory cell comprising:

a storage capacitor capable of storing one of more than two different voltage levels, said capacitor having a first terminal and a second terminal;

an n-channel FET having a source terminal coupled to the first terminal of said capacitor, a drain terminal, and a gate terminal for receiving a first control signal; and a p-channel FET having a source terminal coupled to the first terminal of said capacitor, a drain terminal, and a gate terminal for receiving a second control signal;

a first bit line coupled to the drain terminals of said n-channel and p-channel FET's;

a first word line coupled to the gate terminal of said n-channel FET for conveying said first control signal; and a second word line coupled to the gate terminal of said p-channel FET for conveying said second control signal.

18. The memory device of claim 17, further comprising:

means for receiving a input voltage signal which varies in magnitude over time in predetermined increments; and a driving gate responsive to a driving control signal for coupling said receiving means to said bit line.

19. The memory device of claim 18, further comprising:

a comparator coupled to said bit line for comparing a voltage stored in said capacitor to a reference voltage.

20. The memory device of claim 17, further comprising:

a discharge switching element coupled to the first and second terminals of said capacitor for selectively discharging said capacitor.

21. The memory device of claim 20, wherein said discharge switching element comprises:

an n-channel MOSFET having a drain terminal coupled to the first terminal of said capacitor, a source terminal coupled to the second terminal of said capacitor, and a gate terminal for receiving a first reset control signal; and a p-channel MOSFET having a drain terminal coupled to the first terminal of said capacitor, a source terminal coupled to the second terminal of said capacitor, and a gate terminal for receiving a second reset control signal.

22. The memory device of claim 17, wherein said memory device further comprises a second bit line, and wherein said memory cell further comprises a switching element coupled to both the second terminal of said capacitor and said second bit line for selectively electrically isolating said capacitor from noise generated by other components.

23. The memory device of claim 22, wherein said switching element comprises:

an n-channel FET having a drain terminal coupled to the second terminal of said capacitor, a source terminal coupled to said second bit line, and a gate terminal coupled to said first word line; and a p-channel FET having a drain terminal coupled to the second terminal of said capacitor, a source terminal coupled to said second bit line, and a gate terminal coupled to said second word line.

24. The memory device of claim 22, further comprising:

a discharge switching element coupled to said first and second bit lines for selectively discharging said bit lines.

25. The memory device of claim 24, wherein said discharge switching element comprises:

an n-channel MOSFET having a drain terminal coupled to said first bit line, a source terminal coupled to said second bit line, and a gate terminal for receiving a first discharge control signal; and a p-channel MOSFET having a drain terminal coupled to said first bit line, a source terminal coupled to said second bit line, and a gate terminal for receiving a second discharge control signal.

* * * * *